(12) United States Patent
Tiwari et al.

(10) Patent No.: US 10,950,584 B2
(45) Date of Patent: Mar. 16, 2021

(54) WHITE LIGHT EMITTING DEVICES HAVING HIGH LUMINOUS EFFICIENCY AND IMPROVED COLOR RENDERING THAT INCLUDE PASS-THROUGH VIOLET EMISSIONS

(71) Applicant: Ideal Industries Lighting LLC, Durham, NC (US)

(72) Inventors: Nishant Tiwari, Apex, NC (US); Al Safarikas, Cary, NC (US); David Power, Morrisville, NC (US)

(73) Assignee: Ideal Industries Lighting LLC, Sycamore, IL (US)

( * ) Notice: Subject to any disclaimer, the term of this patent is extended or adjusted under 35 U.S.C. 154(b) by 0 days.

(21) Appl. No.: 16/717,389

(22) Filed: Dec. 17, 2019

(65) Prior Publication Data
US 2020/0126956 A1 Apr. 23, 2020

Related U.S. Application Data

(63) Continuation of application No. 16/179,126, filed on Nov. 2, 2018, now Pat. No. 10,546,843.

(60) Provisional application No. 62/581,174, filed on Nov. 3, 2017.

(51) Int. Cl.
| | | |
|---|---|---|
| H01L 25/075 | (2006.01) | |
| H01L 33/50 | (2010.01) | |
| F21K 9/232 | (2016.01) | |
| F21Y 103/10 | (2016.01) | |
| F21Y 115/10 | (2016.01) | |
| F21Y 113/17 | (2016.01) | |

(52) U.S. Cl.
CPC .......... *H01L 25/0753* (2013.01); *F21K 9/232* (2016.08); *H01L 33/504* (2013.01); *F21Y 2103/10* (2016.08); *F21Y 2113/17* (2016.08); *F21Y 2115/10* (2016.08)

(58) Field of Classification Search
CPC ... H01L 25/0753; H01L 33/504; F21K 9/232; F21Y 2113/17; F21Y 2103/10; F21Y 2115/10
USPC ......................................................... 257/89
See application file for complete search history.

(56) References Cited

U.S. PATENT DOCUMENTS

| | | | |
|---|---|---|---|
| 9,500,327 B2 | 11/2016 | Oepts | |
| 9,799,243 B2* | 10/2017 | van de Ven | ............ H05B 45/10 |
| 10,141,484 B2 | 11/2018 | Asai | |
| 2007/0158668 A1 | 7/2007 | Tarsa | |
| 2008/0173884 A1 | 7/2008 | Chitnis et al. | |
| 2008/0179611 A1 | 7/2008 | Chitnis | |

(Continued)

*Primary Examiner* — Tu-Tu V Ho
(74) *Attorney, Agent, or Firm* — Myers Bigel, PA

(57) ABSTRACT

A lighting apparatus a first group of at least one first solid state emitter, each first solid state emitter including a first light emitting diode ("LED") that, when excited, emits light having a peak wavelength in a range between about 440 nm and about 475 nm, and a second group of at least one second solid state emitter, each second solid state emitter comprising a second LED that, when excited, emits light having a peak wavelength in a range between about 390 nm and about 415 nm. Between about 2% and about 15% of a spectral power of light emitted from the lighting apparatus is light having wavelengths in the range between about 390 nm and about 415 nm.

20 Claims, 13 Drawing Sheets
(5 of 13 Drawing Sheet(s) Filed in Color)

(56) References Cited

U.S. PATENT DOCUMENTS

2009/0108281 A1 4/2009 Keller
2017/0005241 A1 1/2017 Lotito

* cited by examiner

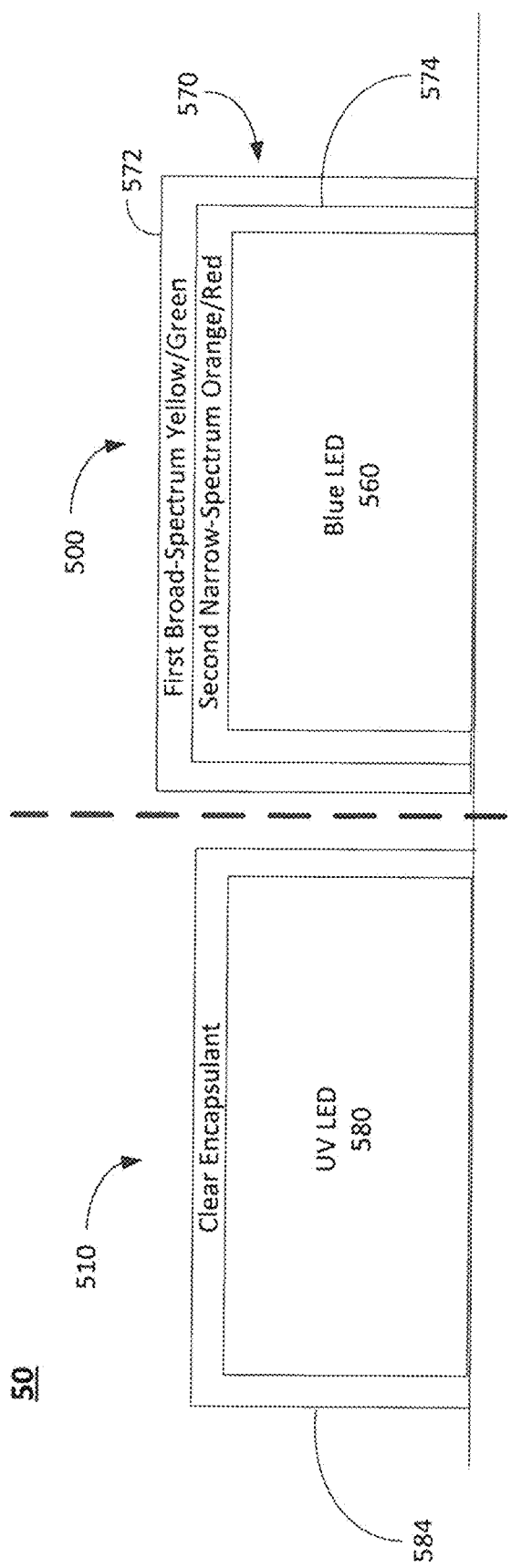

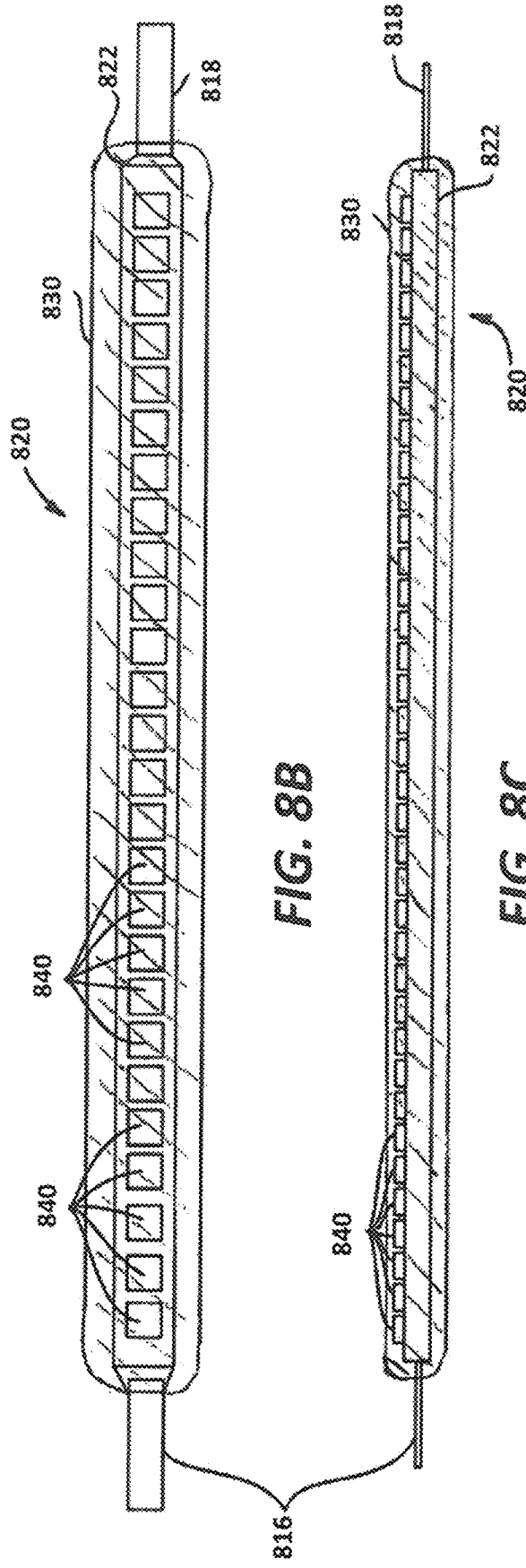

WHITE LIGHT EMITTING DEVICES HAVING HIGH LUMINOUS EFFICIENCY AND IMPROVED COLOR RENDERING THAT INCLUDE PASS-THROUGH VIOLET EMISSIONS

CROSS-REFERENCE TO RELATED APPLICATION

This application is a continuation of U.S. patent application Ser. No. 16/179,126, filed Nov. 2, 2018, entitled "WHITE LIGHT EMITTING DEVICES HAVING HIGH LUMINOUS EFFICIENCY AND IMPROVED COLOR RENDERING THAT INCLUDE PASS-THROUGH VIOLET EMISSIONS," which application claims priority under 35 U.S.C. § 119 to U.S. Provisional Patent Application Ser. No. 62/581,174, filed Nov. 3, 2017, the contents of which are incorporated herein by reference as if set forth in their entireties.

FIELD

The present disclosure relates to light emitting devices, and more particularly, to semiconductor light emitting devices that include luminescent materials.

BACKGROUND

Light emitting devices may include, for example, incandescent bulbs, fluorescent lights, and semiconductor light emitting devices, such as light emitting diodes ("LEDs"). LEDs may include a series of semiconductor layers that may be epitaxially grown on a substrate such as, for example, a sapphire, silicon, silicon carbide, gallium nitride, or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, the electrons will "collide" with corresponding holes and recombine, such that a photon of light may be emitted. The wavelength distribution of the light generated by an LED generally depends on the semiconductor materials used and the structure of the thin epitaxial layers that make up the "active region" of the device, which is where the electron-hole recombination occurs.

LEDs are nearly monochromatic light sources that appear to emit light having a single color. The spectral power distribution of the light emitted by LEDs may be centered about a "peak" wavelength, which is the wavelength where the spectral power distribution or "emission spectrum" of the LED reaches its maximum as detected by a photodetector. The width of the spectral power distribution of LEDs is typically between about 10 nm and 30 nm, where the width may be measured at half of the maximum illumination on each side of the emission peak (this width may be referred to as the full width at half maximum or "FWHM" width).

Visible light may include light having many different wavelengths. The apparent color of visible light can be illustrated with reference to a two-dimensional chromaticity diagram, such as the 1931 CIE Chromaticity Diagram illustrated in FIG. 1, which provides a reference for defining colors as weighted sums of colors. As shown in FIG. 1, colors on the CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution, while colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues of light that may be considered "white," as evidenced by the size of the region 10. For example, some "white" light, such as light generated by high-power sodium vapor lighting devices, may appear yellowish in color, while other "white" light, such as light generated by some fluorescent lighting devices, may appear more bluish in color.

A combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer. Each point in the graph of FIG. 1 is referred to as the "color point" of a light source that emits a light having that color. As shown in FIG. 1 a locus of color points that is referred to as the "black-body" locus 15 exists which corresponds to the location of color points of light emitted by a black-body radiator that is heated to various temperatures. The black-body locus 15 is also referred to as the "Planckian" locus because the chromaticity coordinates (i.e., color points) that lie along the black-body locus obey Planck's equation: $E(\lambda)=A \lambda^{-5}/(e^{B/T}-1)$, where E is the emission intensity, X is the emission wavelength, T is the color temperature of the black-body and A and B are constants. Color coordinates that lie on or near the black-body locus 15 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature (CCT). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color.

SUMMARY

Various embodiments described herein provide lighting devices capable of using light having a peak wavelength in a range between about 390 nm and about 415 nm to generate light that has an improved color rendering performance.

According to some embodiments described herein, a light emitting device includes: a first group of at least one first solid state emitter, each first solid state emitter including a first blue light emitting diode ("LED") that, when excited, emits light having a peak wavelength in a blue color range, and a first luminophoric medium that includes at least a first luminescent material that, when excited by light from the first blue LED, emits light having a peak wavelength in a green color range or a yellow color range, and a second luminescent material that, when excited by light from the first blue LED, emits light having a peak wavelength in an orange color range or a red color range; and a second group of at least one second solid state emitter, each second solid state emitter including a second LED that, when excited, emits light having a peak wavelength in a range between about 390 nm and about 415 nm, where between about 2% and about 15% of a spectral power of light emitted from the light emitting device is light having wavelengths in the range between about 390 nm and about 415 nm.

In some embodiments, the second luminescent material includes a $K_2SiF_6:Mn^{4+}$ phosphor.

In some embodiments, the first luminescent material includes a YAG:Ce phosphor.

In some embodiments, the second group of at least one second solid state emitter does not include any associated luminophoric medium thereon.

In some embodiments, the second group of at least one second solid state emitter further includes a second luminophoric medium.

In some embodiments, the second luminophoric medium is substantially the same as the first luminophoric medium.

In some embodiments, the second luminophoric medium is different from the first luminophoric medium.

In some embodiments, the light emitting device is configured to emit the light having a luminous flux efficiency of between 100 and 140 lumens per watt.

In some embodiments, the light emitting device is configured to emit the light having the luminous flux efficiency of 120 lumens per watt with a color rendering index ("CRI") of at least 94.

In some embodiments, the second luminescent material includes a narrow-spectrum red phosphor.

In some embodiments, the light emitting device includes a first string of solid state emitters connected electrically in series, the first string of solid state emitters including at least one first solid state emitter and at least one second solid state emitter.

In some embodiments, the light emitting device includes a first string of solid state emitters connected electrically in series that includes at least one first solid state emitter and a second string of solid state emitters connected electrically in series that includes at least one second solid state emitter.

In some embodiments, a ratio of a first chip area of the first group of at least one first solid state emitter to a second chip area of the second group of at least one second solid state emitter is between 2:1 and 4:1.

In some embodiments, between about 3% and about 10% of the spectral power of light emitted from the light emitting device is light having wavelengths in the range between about 390 nm and about 415 nm.

In some embodiments, between about 2% and about 15% of the spectral power of light emitted from the light emitting device is light having wavelengths in the range between about 400 nm and about 410 nm.

In some embodiments, between about 4% and about 8% of the spectral power of light emitted from the light emitting device is light having wavelengths in the range between about 400 nm and about 410 nm.

In some embodiments, exciting the second group of the at least one second solid state emitter is configured to increase a saturation of the light emitted from the light emitting device in the green color range while maintaining a luminous flux efficiency of the light emitting device between 100 lumens per watt and 140 lumens per watt.

In some embodiments, exciting the second group of the at least one second solid state emitter is configured to increase a saturation of the light emitted from the light emitting device in the yellow color range.

In some embodiments, exciting the second group of the at least one second solid state emitter is configured to increase a saturation of the light emitted from the light emitting device in the blue color range while maintaining a luminous flux efficiency of the light emitting device between 100 lumens per watt and 140 lumens per watt.

In some embodiments, exciting the second group of the at least one second solid state emitter is configured to increase a saturation of the light emitted from the light emitting device in a violet color range while maintaining a luminous flux efficiency of the light emitting device between 100 lumens per watt and 140 lumens per watt.

According to some embodiments described herein, a lighting apparatus includes: a first group of at least one first solid state emitter, each first solid state emitter including a first light emitting diode ("LED") that, when excited, emits light having a peak wavelength in a range between about 440 nm and about 475 nm; and a second group of at least one second solid state emitter, each second solid state emitter including a second LED that, when excited, emits light having a peak wavelength in a range between about 390 nm and about 415 nm, where between about 2% and about 15% of a spectral power of light emitted from the lighting apparatus is light having wavelengths in the range between about 390 nm and about 415 nm.

In some embodiments, between about 2% and about 15% of the spectral power of the light emitted from the lighting apparatus is light having wavelengths in the range between about 400 nm and about 410.

In some embodiments, between about 2% and about 15% of the spectral power of the light emitted from the lighting apparatus is light having wavelengths in the range between about 402 nm and about 409.

In some embodiments, the lighting apparatus further comprises a luminophoric medium on the first LED or the second LED.

In some embodiments, the luminophoric medium comprises at least a first luminescent material that, when excited by the light from the first LED or the second LED, emits light having a peak wavelength in a yellow color range, and a second luminescent material that, when excited by light from the first LED or the second LED, emits light having a peak wavelength in a red color range.

In some embodiments, the second luminescent material comprises a $K_2SiF_6:Mn^{4+}$ phosphor.

In some embodiments, the first luminescent material comprises a YAG:Ce phosphor.

In some embodiments, the first group and the second group are electrically connected in series.

In some embodiments, the first group and the second group are electrically connected in parallel.

In some embodiments, a first portion of the first group and a first portion of the second group are electrically connected in series in a first LED string, a second portion of the first group and a second portion of the second group are electrically connected in series in a second LED string, and the first LED string and the second LED string are electrically connected in parallel.

In some embodiments, exciting the second group of the at least one second solid state emitter is configured to increase a saturation of the light emitted from the lighting apparatus in a green color range while maintaining a luminous flux efficiency of the lighting apparatus between 100 lumens per watt and 140 lumens per watt.

In some embodiments, exciting the second group of the at least one second solid state emitter is configured to increase a saturation of the light emitted from the lighting apparatus in a yellow color range.

In some embodiments, exciting the second group of the at least one second solid state emitter is configured to increase a saturation of the light emitted from the lighting apparatus in a blue color range while maintaining a luminous flux efficiency of the lighting apparatus between 100 lumens per watt and 140 lumens per watt.

In some embodiments, exciting the second group of the at least one second solid state emitter is configured to increase a saturation of the light emitted from the lighting apparatus in a violet color range while maintaining a luminous flux efficiency of the lighting apparatus between 100 lumens per watt and 140 lumens per watt.

According to some embodiments described herein, a light emitting device, includes: a first group of at least one first solid state emitter, each first solid state emitter including a first light emitting diode ("LED") that, when excited, emits light having a peak wavelength in a range between about 440 nm and about 475 nm; and a second group of at least one second solid state emitter, each second solid state emitter including a second LED that, when excited, emits light having a peak wavelength in a range between about 390 nm and about 415 nm, where the emission of the light in the 390 nm to 415 nm wavelength range is configured to increase a saturation of a remainder of the emitted light of the light emitting device in a green-yellow color range by at least 10%.

In some embodiments, the light having wavelengths in the range between about 390 nm and about 415 nm is configured to increase the saturation of the emitted light in the green-yellow color range while maintaining a luminous flux efficiency of the light emitting device between 100 lumens per watt and 140 lumens per watt.

In some embodiments, the light having wavelengths in the range between about 390 nm and about 415 nm is configured to increase a saturation of the emitted light in a green color range while maintaining a luminous flux efficiency of the light emitting device between 100 lumens per watt and 140 lumens per watt.

In some embodiments, the light having wavelengths in the range between about 390 nm and about 415 nm is configured to increase a saturation of the emitted light in a blue color range while maintaining a luminous flux efficiency of the light emitting device between 100 lumens per watt and 140 lumens per watt.

In some embodiments, the light having wavelengths in the range between about 390 nm and about 415 nm is configured to increase a saturation of the emitted light in a violet color range while maintaining a luminous flux efficiency of the light emitting device between 100 lumens per watt and 140 lumens per watt.

In some embodiments, between about 2% and about 15% of the spectral power of the light emitted from the light emitting device is light having wavelengths in the range between about 400 nm and about 410.

In some embodiments, the light emitting device further includes a luminophoric medium on the first LED or the second LED.

In some embodiments, the luminophoric medium includes at least a first luminescent material that, when excited by the light from the first LED or the second LED, emits light having a peak wavelength in a yellow color range, and a second luminescent material that, when excited by light from the first LED or the second LED, emits light having a peak wavelength in a red color range.

In some embodiments, the second luminescent material comprises a $K_2SiF_6:Mn^{4+}$ phosphor.

In some embodiments, the first luminescent material comprises a YAG:Ce phosphor.

In some embodiments, the emission of the light in the 390 nm to 415 nm wavelength range is configured to increase the saturation of the remainder of the emitted light of the light emitting device in the 4, 5, 6, and 7 TM-30 hue angle bins by at least 10%.

In some embodiments, the emission of the light in the 390 nm to 415 nm wavelength range is configured to increase the saturation of the remainder of the emitted light of the light emitting device in the 8 TM-30 hue angle bin by at least 5%.

According to some embodiments described herein, a light emitting device, includes: a first group of at least one first solid state emitter, each first solid state emitter including a first blue light emitting diode ("LED") that, when excited, emits light having a peak wavelength in a blue color range, and a first luminophoric medium: and a second group of at least one second solid state emitter, each second solid state emitter including a second LED that, when excited, emits light having a peak wavelength in a range between about 390 nm and about 415 nm, wherein the second group of at least one second solid state emitter does not include any associated luminophoric medium thereon.

In some embodiments, the first luminophoric medium comprises at least a first luminescent material that, when excited by light from the first blue LED, emits light having a peak wavelength in a green color range or a yellow color range, and a second luminescent material that, when excited by light from the first blue LED, emits light having a peak wavelength in an orange color range or a red color range.

In some embodiments, between about 2% and about 15% of a spectral power of light emitted from the light emitting device is light having wavelengths in the range between about 390 nm and about 415 nm.

In some embodiments, exciting the second group of the at least one second solid state emitter is configured to increase a saturation of the light emitted from the light emitting device in a green color range while maintaining a luminous flux efficiency of the light emitting device between 100 lumens per watt and 140 lumens per watt.

In some embodiments, exciting the second group of the at least one second solid state emitter is configured to increase a saturation of the light emitted from the light emitting device in a yellow color range.

In some embodiments, exciting the second group of the at least one second solid state emitter is configured to increase a saturation of the light emitted from the light emitting device in the 4, 5, 6, and 7 TM-30 hue angle bins by at least 10% while maintaining a luminous flux efficiency of the light emitting between 100 lumens per watt and 140 lumens per watt.

In some embodiments, exciting the second group of the at least one second solid state emitter is configured to increase a saturation of the light emitted from the light emitting device in the 8 TM-30 hue angle bin by at least 5%.

In some embodiments, the light having a peak wavelength in the range between about 390 nm and about 415 nm is emitted from the light emitting device without passing through a luminophoric medium

BRIEF DESCRIPTION OF THE DRAWINGS

The patent or application file contains at least one drawing executed in color. Copies of this patent or patent application publication with color drawings will be provided by the Office upon request and payment of the necessary fee.

FIGS. 5A, 5B, and 5C are schematic diagrams illustrating various lighting devices utilizing configurations of first and second solid state emitters according to embodiments of the present invention.

FIGS. 8A, 8B, and 8C are perspective views of a semiconductor light emitting device according to further embodiments of the present invention.

Figure 1:
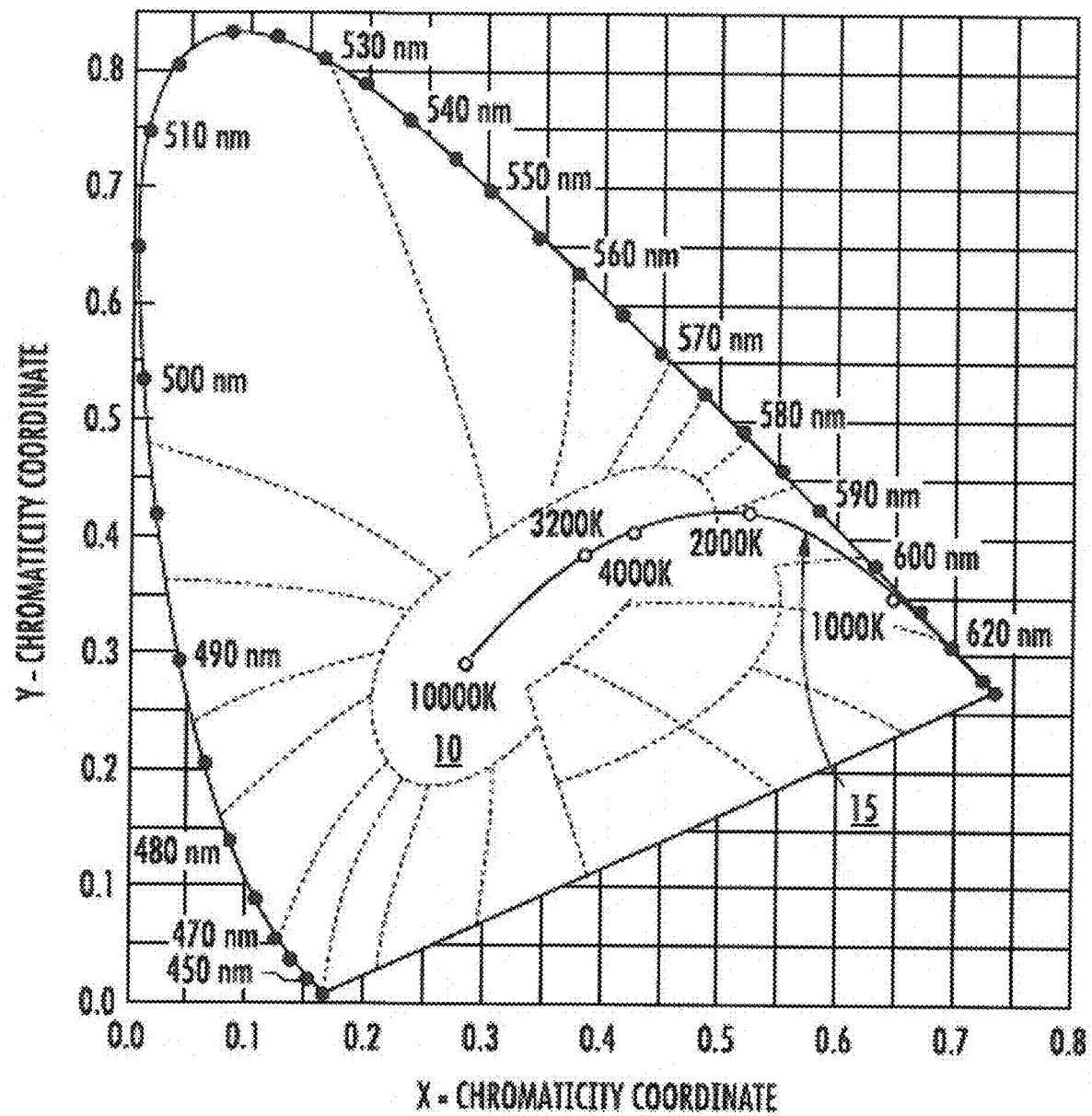
FIG. 1 illustrates the 1931 CIE Chromaticity Diagram for defining colors by chromaticity coordinates.

It should be noted that these figures are intended to illustrate the general characteristics of methods, structure, and/or materials utilized in certain example embodiments and to supplement the written description provided below. These drawings are not, however, to scale and may not precisely reflect the structural or performance characteristics of any given embodiment, and should not be interpreted as defining or limiting the range of values or properties encompassed by example embodiments of the invention. For example, the relative thicknesses and positioning of layers, regions, and/or structural elements may be reduced or exaggerated for clarity. The use of similar or identical reference numbers in the various drawings is intended to indicate the presence of a similar or identical element or feature.

DETAILED DESCRIPTION

As used herein, the term "light emitting device" may include LEDs, laser diodes and any other semiconductor light emitting devices that includes one or more semiconductor layers, as well as packaged lamps, bulbs, fixtures and the like which include such semiconductor light emitting devices. The semiconductor layers included in these devices may include silicon, silicon carbide, gallium nitride and/or other semiconductor materials, an optional semiconductor or non-semiconductor substrate, and one or more contact layers which may include metal and/or other conductive materials. The expression "light emitting device" and/or "lighting apparatus," as used herein, is not limited, except that it be a device that is capable of emitting light.

Semiconductor light emitting devices according to embodiments of the disclosure may include III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the substrate in a so-called "flip chip" orientation. Semiconductor light emitting devices according to embodiments of the present disclosure include both vertical devices with a cathode contact on one side of the LED, and an anode contact on an opposite side of the LED and devices in which both contacts are on the same side of the device. The design and fabrication of semiconductor light emitting devices are well known to those skilled in the art, and hence further description thereof will be omitted.

It will be understood that the term LED "string" refers to a configuration of LEDs that allows a respective current (such as a full-on current) to be enabled/disabled through that configuration separately from enabling/disabling other respective currents through other LED strings in the apparatus. A string can include at least one LED device. Each string may include multiple LEDs that are connected in various parallel and/or serial arrangements such that each string may be provided with the respective full-on current for that string separately from the provisioning of the other LED strings. The strings of LEDs may be configured in a number of different configurations. A lighting apparatus may include one or more LED strings, and may further include a control circuit configured to control a current and/or voltage provided to the one or more LED strings.

An LED can be characterized as having a particular spectral power distribution, which can affect various light characteristics of the light emitted by the LED. It will be understood that a spectral power distribution can be used to express the power per unit area per unit wavelength of an illumination (radiant exitance). A lighting apparatus that includes LEDs can also have a spectral power distribution which is a measure of the combined light emitted by the individual LEDs.

To generate white light, LED lamps have been provided that include several LEDs that each emit light of a different color, where the different-colored light emitted by the LEDs combine to produce a desired intensity and/or color of white light. For example, simultaneously energizing red, green, and blue LEDs may result in a combination of light that may appear white, or nearly white, depending on, for example, the relative intensities, peak wavelengths, and spectral power distributions of the source red, green, and blue LEDs.

Additionally or alternatively, white light may also be produced by surrounding a single LED with one or more luminescent materials, such as phosphors, that absorb some of the light emitted by the LED and responsively emit light of one or more other colors. This process is also referred to herein as "converting" some of the light emitted by the LED to the light of the other color(s). The combination of the light emitted by the single colored LED that is not converted by luminescent materials and the light of other color(s) that are emitted by the luminescent materials may produce light that appears to be white or near white to an observer. Herein, the term "phosphor" may refer to any material that absorbs light at one wavelength and re-emits light at a different wavelength in the visible spectrum, regardless of the delay between absorption and re-emission and regardless of the wavelengths involved. Thus, the term "phosphor" encompasses nanophosphors, quantum dots, and materials that are sometimes called fluorescent and/or phosphorescent.

Some white LEDs may use conventional rare earth doped inorganic red and green phosphors. For example, a nitride based red phosphor and a garnet green/yellow phosphor may be used in combination with a blue emitting LED to generate warm white light output. For instance, a white LED lamp may be formed by coating a gallium nitride based blue LED with a yellow luminescent material, such as a cerium doped yttrium aluminum garnet phosphor, which is commonly referred to as YAG:Ce. The blue LED produces an emission with a peak wavelength of, for example, about 460 nm. Some of the blue light emitted by the LED passes between and/or through the YAG:Ce phosphor particles without being down-converted (i.e., converted to light having a longer wavelength), while other of the blue light emitted by the LED is absorbed by the YAG:Ce phosphor, which becomes excited and emits yellow fluorescence with a peak wavelength of about 550 nm (i.e., the blue light is down-converted to yellow light). The combination of blue light and yellow light that is emitted by the coated LED may appear white to an observer. Such light is typically perceived as being cool white in color, as it is primarily comprises light on the lower half (shorter wavelength side) of the visible emission spectrum. To make the emitted white light appear more "warm" and/or exhibit better color rendering properties, red-light emitting luminescent materials such as $Eu^{2+}$ doped $CaAlSiN_3$-based phosphor particles may be added to the coating.

A medium that includes one or more luminescent materials that is positioned to receive light that is emitted by an LED or other semiconductor light emitting device is referred to herein as a "luminophoric medium." Exemplary luminophoric mediums include layers having luminescent materials that are coated or sprayed directly onto a semiconductor light emitting device or on surfaces of the packaging thereof, and clear encapsulants (e.g., epoxy-based or silicone-based curable resin) that include luminescent materials that are arranged to partially or fully cover a semiconductor light emitting device. A luminophoric medium may include one medium layer or the like in which one or more luminescent materials are mixed, multiple stacked layers or mediums, each of which may include one or more of the same or different luminescent materials, and/or multiple spaced apart layers or mediums, each of which may include the same or different luminescent materials.

Embodiments of the present invention are directed to semiconductor light emitting devices that have LEDs and luminophoric mediums that include luminescent materials that have peak emission wavelengths in various color ranges. For purposes of this disclosure, the various color ranges of light in the visible and near-visible spectra are defined as shown in Table 1 below. It will be appreciated, however, that there are not sharp boundaries between different colors of the spectrum. For example, light having wavelengths from 430-450 nm may appear blue-violet, while light having wavelengths from 530-560 nm may appear yellow-green, etc.

TABLE 1

| Color | Wavelength Range (nm) |
|---|---|
| Ultra-Violet/Violet | 380-439 |
| Blue | 440-479 |
| Cyan | 480-510 |
| Green | 511-549 |
| Yellow | 550-580 |
| Orange | 581-604 |
| Red | 605-700 |

An LED or a luminescent material that emits light having a peak wavelength in one of the above color ranges may be referred to with reference to the color range. By way of example, a phosphor that emits light having a peak wavelength of 630 nanometers may be referred to herein as a "red phosphor," while a phosphor that emits light having a peak wavelength of 535 nanometers may be referred to as a "green phosphor."

A luminophoric medium that includes, for example, a yellow phosphor, may be used in conjunction with a blue LED to provide a white light emitting device. Such a device typically emits cool white light that often has a lower CRI value. The previously-described YAG:Ce is an example of such a yellow phosphor.

In order to increase the "warmth" of the emitted white light and/or to improve the CRI of the device, red phosphor particles may be added to the luminophoric medium. Nitride-based red phosphors often used have a broad emission spectrum (e.g., FWHM widths of greater than 70 nm) and relatively high peak wavelengths (e.g., between about 630 nm and about 660 nm). Other nitride-based red phosphors are available that have lower peak wavelengths (e.g., between about 611 nm and about 629 nm) and generally narrower emission spectrum (e.g., FWHM widths of between 35 nm and 40 nm). Herein, phosphors or other luminescent materials that have FWHM widths of greater than or equal to about 70 nm are referred to as "broad-spectrum" luminescent materials or emitters. Luminescent materials that have an emission spectrum having a FWHM width of less than 70 nm are referred to herein as "narrow-spectrum" luminescent materials. Narrow-spectrum luminescent materials may also be used in conjunction with, or instead of, broad-spectrum luminescent materials. In some embodiments, a narrow-spectrum orange or red/orange emitter (e.g., having an emission peak in the 581-610 nm wavelength range) may be used as one of the luminescent materials.

The ability of a light source to accurately reproduce color in illuminated objects is often characterized using the color rendering index (CRI). The CRI of a light source is a modified average of the relative measurements of how the color rendition of an illumination system compares to that of a reference black-body radiator when illuminating eight reference colors. Thus, the CRI is a relative measure of the shift in surface color of an object when lit by a particular lamp. The CRI equals 100 if the color coordinates of a set of test colors being illuminated by the illumination system are the same as the coordinates of the same test colors being irradiated by the black-body radiator. Daylight generally has a CRI of nearly 100, incandescent bulbs have a CRI of about 95, fluorescent lighting typically has a CRI of about 70 to 85, while monochromatic light sources have a CRI of essentially zero. Light sources for general illumination applications with a CRI of less than 50 are generally considered very poor and are typically only used in applications where economic issues preclude other alternatives. For some general interior illumination, a CRI value of greater than 80 may be acceptable. A light source with color coordinates within 4 MacAdam step ellipses of the Planckian locus 15 (FIG. 1) and a CRI value that exceeds 85 is more suitable for general illumination purposes. Light sources with CRI values of more than 90 provide greater color quality.

For general illumination and various other applications, it is often desirable to provide a lighting source that generates white light having a relatively high CRI, so that objects illuminated by the lighting source may appear to have more natural coloring to the human eye.

Figure 2:
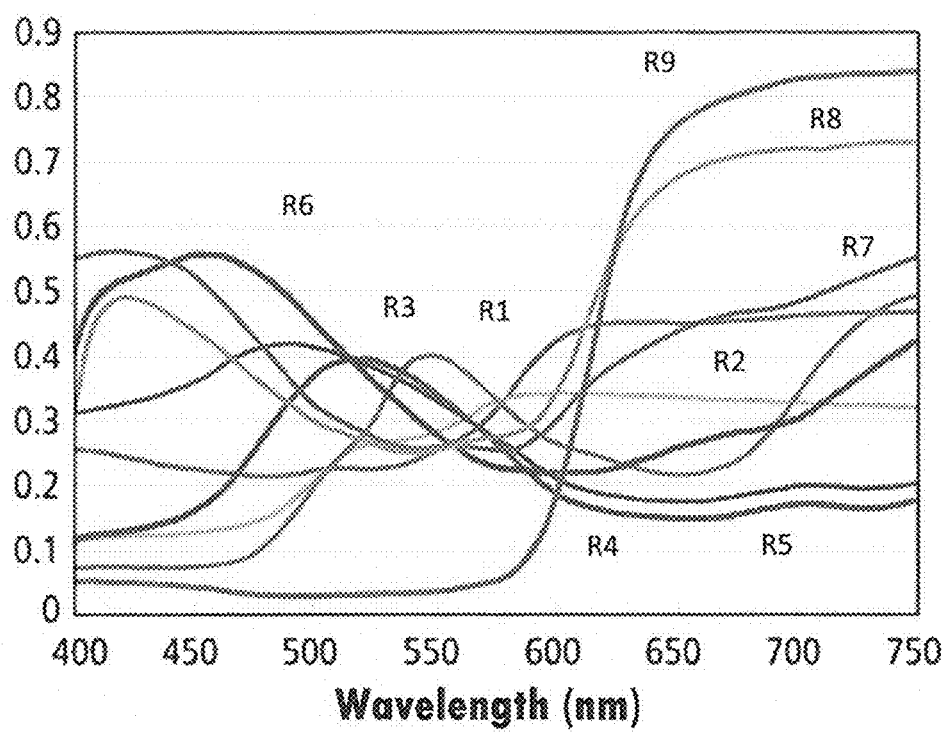
FIG. 2 is a graph illustrating color samples associated with the color rendering index as a function of wavelength.

While CRI is useful in gauging the color rendering performance of a light source, standing alone, CRI may not always provide a satisfactory measure of the color quality. In particular, CRI is an average color rendering value for eight specific sample colors that are generally referred to as R1-R8. FIG. 2 illustrates the color samples R1-R8 as a function of wavelength. These eight color samples R1-R8 are primarily pastel shades, as opposed to saturated colors. As such, light emitting devices that emit light having high CRI values may still fall short in rendering certain hues such as red hues. For example, the red content of a light source may be important for accurately rendering colors of various foods, skin tones, wood, furniture, and other objects. Only a few of the color samples used to compute CRI have significant red content (namely sample R1, which is a pink shade, and sample R8, which is a purple shade), and these samples are not saturated color samples. As such, high CRI scores may be achieved even without significant red content in a light source, and thus a high CRI score may be achieved in some cases even though the light source may not do a good job of rendering red hues.

In order to address this issue, seven additional color samples, labeled CRI R9-R15, have been defined that measure the color rendering of a light source for either saturated colors (R9-R12, corresponding to saturated red, yellow, green and blue light) or for other colors (R13-R15) corresponding to two different skin tones and leaf green. These color samples are not used in calculating CRI, which is based solely on color samples R1-R8, but may be important when evaluating the color rendering performance of a particular light source. The sample color R9 is the saturated red color, and it is generally known that the ability to reproduce red colors well is important for accurately rendering colors, as the color red is often found mixed into processed colors. Accordingly, all else being equal, lamps with high R9 values tend to produce the most vivid colors. Thus, the CRI R9 value of light emitted by a light source is also often considered to be an important performance parameter for the light source. FIG. 2 also illustrates CRI R9 with respect to the other color samples R1-R8.

In addition, CRI also confers limited ability to predict color discrimination (i.e., to perceive subtle difference in hue) or color preference. There appears to be a natural human attraction to brighter color. Daylight provides a spectrum of light that allows the human eye to perceive bright and vivid colors, which allows a human observer to distinguish objects having even very subtle color shade differences. Accordingly, it is generally recognized that daylight and blackbody sources are superior to many artificial light sources for emphasizing and distinguishing color. The ability of human vision to differentiate color is different under correlated color temperature conditions providing the same CRI.

Another important performance parameter for an LED lighting source is the intensity of the light emitted, which is referred to as the "radiant flux" of the device. However, as the human eye has varying sensitivity to different wavelengths of light, the intensity of the light emitted by a lighting source is most typically measured in terms of the lighting source's "luminous flux," which is a measure of the power of the light emitted by a light source as perceived by a human observer. The luminous flux of a light source is typically measured in lumens (lm). The luminous flux of a light source differs from the radiant flux of the light source in that the radiant flux measures the total power emitted, while the luminous flux weights the power of the light emitted at each wavelength based on a luminosity function which represents the response of the human eye for each different wavelength.

Figure 3:
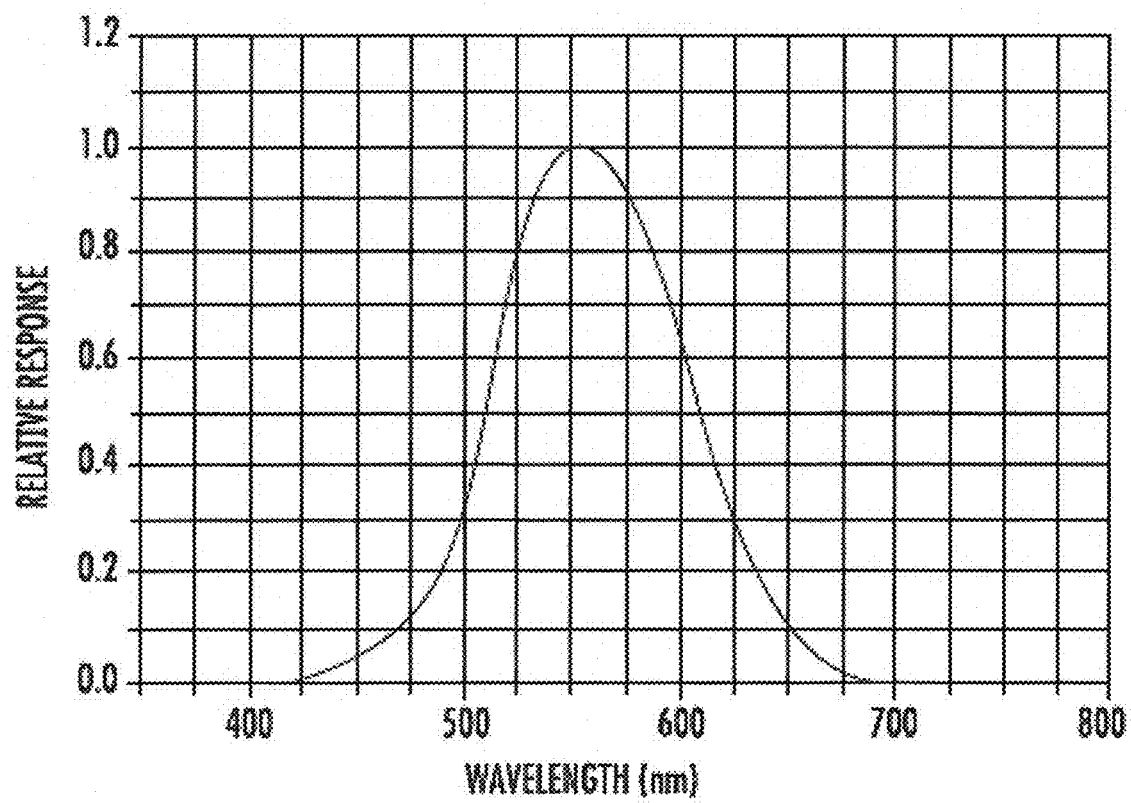
FIG. 3 is a graph of a luminosity function that corresponds to the response of the human eye to light in the visible light spectrum.

FIG. 3 is a graph of the above-referenced luminosity function that corresponds to the response of the human eye to light in the visible light spectrum. As shown in FIG. 3, the human eye cannot typically perceive light at wavelengths below about 400 nanometers and above about 700 nanometers. The maximum response of the human eye to light occurs at about 555 nanometers. In calculating luminous flux, the radiant flux of a light source is weighted based on the eye sensitivity curve of FIG. 3. As the amount of light emitted by an LED is generally a function of the power input to the LED, the luminous flux performance of semiconductor light emitting devices are typically compared with each device being driven at the same input power level or, alternatively, the devices may be compared in terms of the luminous flux per unit of input power (e.g., lumens per Watt) that each device emits at the input power level for which each device is designed to operate. As used herein, the term "luminous flux efficiency" will be used to denote luminous flux per unit of input power for a light emitting device.

Because of the varying sensitivity of the human eye to light of different wavelengths, there tends to be a tradeoff between the luminous flux of the light emitted by an LED lighting source and the CRI of the light emitted. For example, since the human eye is most sensitive to light at a wavelength of about 555 nm, a monochromatic light source at 555 nm would exhibit a high luminous flux value. However, in order to obtain high CRI values, it is generally necessary to have light contribution across a wide range of wavelengths, including wavelengths that are relatively far away from 555 nm where the peak sensitivity of light to the human eye occurs. This is particularly true with respect to CRI R9 performance which is a measure of color rendering in the red color range. Because the human eye has reduced sensitivity to the wavelengths on either end of the visible light spectrum, the light contributions that are often added to improve the CRI of a device may result in a decrease in the luminous flux efficiency of the device.

The above tradeoff is particularly evident for ultraviolet (UV) contributions of light from a lighting apparatus. As used herein, UV light refers to light having a wavelength between about 390 nm and about 415 nm. Because UV light is generally not visible or barely visible to the human eye, it contributes little to the CRI score of emitted light. Similarly, because the human eye has little sensitivity for UV light, any power utilized to generate the UV light does not generate a corresponding perception in the human eye. As a result, the lumens per watt of a lighting apparatus may decrease as the UV light emitted by the device increases.

However, the inventors have recognized a marked increase in perceived quality of color rendered by light incorporating UV light in combination with other emitted light of a lighting apparatus. In particular, though this UV light may not noticeably change the CRI rating of the lighting apparatus, incorporating UV light as a portion of the emitted light of the lighting apparatus results in a visibly different color rendering by the light output that is immediately perceptible to humans. As noted above, the CRI of a device does not always represent a true comparison of how a human perceives color rendered by an emitted light. The present invention recognizes that, though providing a UV contribution is counterintuitive to the composition of emitted LED light, it nonetheless may provide markedly improved perceived color rendering if provided in the correct amount and spectral range. For example, lighting devices incorporating UV light as part of the emitted light results in white light that renders colors more crisply than emitted light without such UV light.

Figure 4:
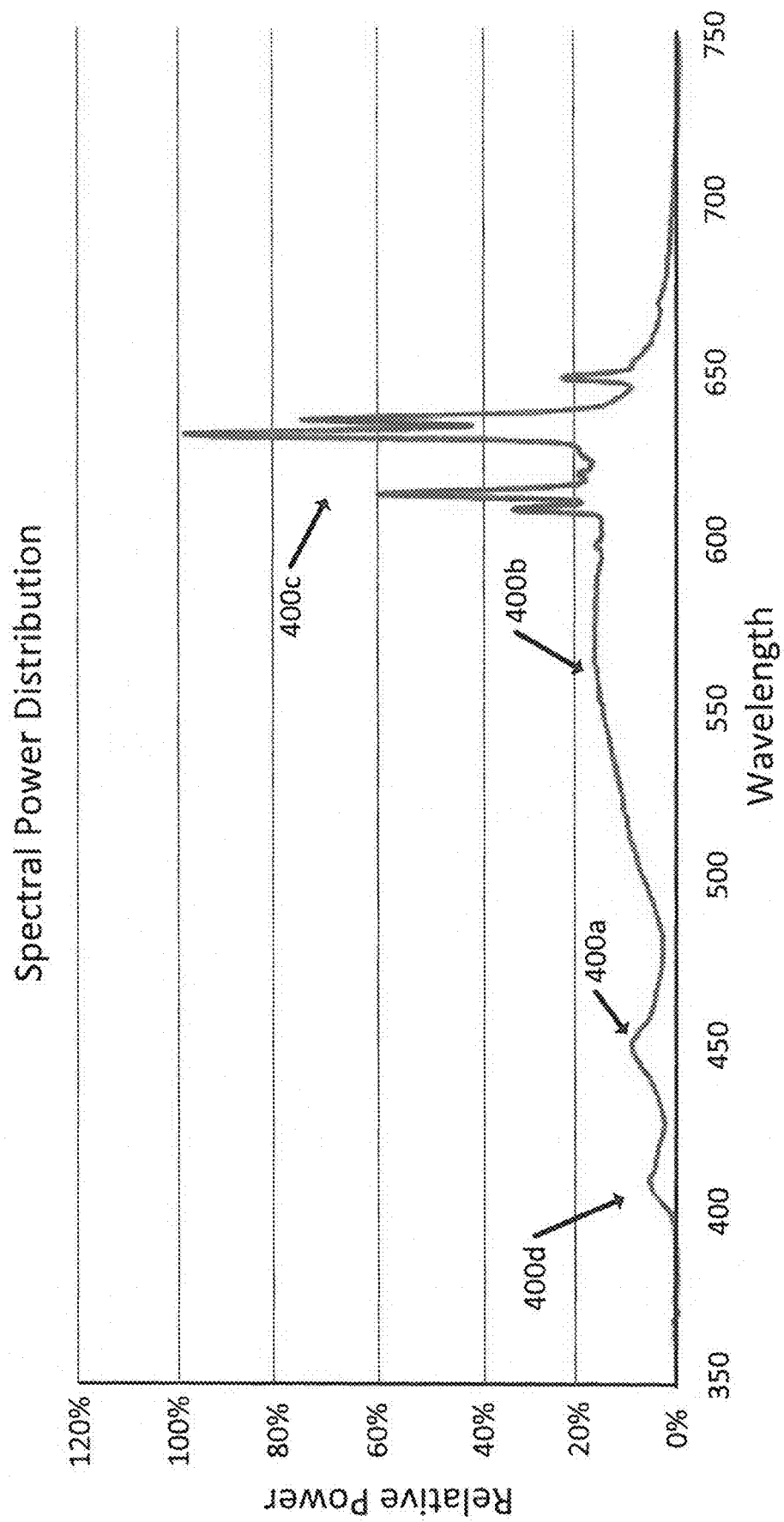
FIG. 4 is a graph illustrating an example of a spectral power distribution of a lighting device according to embodiments of the present invention.

FIG. 4 illustrates an example of a spectral power distribution of a lighting device according to embodiments described herein. The spectral power distribution of a lighting device that includes combinations of LED strings can create an overall spectral power distribution for the lighting apparatus which can change based on which of the LED strings are on and for how long each of the LED strings is on. This timing associated with the LED strings having associated spectral power distributions can affect the lighting characteristics of the lighting apparatus including the CCT, the Color Quality Scale (CQS), the dominant wavelength, the GAI, peak wavelength, the S/P ratio, the nonlinear brightness, the luminous efficacy, and the like. Other lighting characteristics can also be included within the definition of the spectral power distribution.

As shown in FIG. 4, the spectral power of emitted light according to embodiments of the invention may include several contributions. For example, the light output may have generally blue light 400a (e.g., light in the blue color range of wavelengths). The blue light 400a may include light having a peak emission near 450 nm. The light output may also include contributions in the green/yellow color range 400b and in the orange/red color range 400c. As illustrated in FIG. 4, the light contributions in the green/yellow color range 400b may be of a broader spectrum than the contributions in the red/orange color range 400c, though the embodiments described herein are not limited thereto.

As also illustrated in FIG. 4, the spectral power output may also include a UV contribution 400d (e.g., light have a wavelength between about 390 nm and about 415 nm). With respect to the total spectral power output, the UV contribution 400d may include between 2% and 15% of the total spectral power output. That is to say that the UV contribution of the total spectral power output of the lighting device may include between about 2% and about 15% of the area under the spectral power distribution curve of the lighting device. In some embodiments, the percentage of the UV contribution may be between about 3% and about 10% of the total spectral power output. In some embodiments, the percentage of the UV contribution may be between about 4% and about 8% of the total spectral power output.

In some embodiments, achieving the correct percentage of UV contribution may include providing a lighting device with a ratio of light emitting chip area of 1:2 and 1:4 between UV light and light of other wavelengths. In some embodiments, a light-emitting chip area ratio of 1:3 between UV light and light of other wavelengths may be used.

Lighting devices utilizing a UV contribution to the emitted light as illustrated, for example, in FIG. 4 may be capable of generating light having a CRI of between 90-99 with luminous flux performance between 100 and 140 lumens per watt. In some embodiments, the lighting devices may be capable of generating light having a CRI of between 90-99 with luminous flux performance between 100 and 150 lumens per watt. In some embodiments, the lighting devices may be capable of generating light having a CRI of between 90-99 with luminous flux performance between 100 and 160 lumens per watt.

To achieve the power distribution as shown in the example of FIG. 4, LED chips emitting UV light may be combined with LEDs emitting other wavelengths of light. For example, FIG. 5A illustrates a lighting device 50 including a first solid state emitter 500 and a second solid state emitter 510. The second solid state emitter 510 is configured to emit UV light, and the first solid state emitter 500 is configured to emit light of other wavelengths. As shown in FIG. 5A, the first solid state emitter 500 includes a blue LED 560 and a luminophoric medium 570. The luminophoric medium 570 may include one or more constituent materials. For example, in some embodiments, the luminophoric medium 570 may include one or more layers of phosphors configured to convert some of the light emitted by the blue LEDs 560 to one or more different wavelengths.

In the example illustrated in FIG. 5A, the luminophoric medium 570 may include a first broad-spectrum phosphor 572 that emits light having a peak wavelength of about 550 nm (which may be in the green color range or the yellow color range depending upon the exact peak wavelength). For example, the first broad-spectrum phosphor 572 may be $Y_3Al_5O_{12}$:Ce ("YAG:Ce"), though the embodiments described herein are not limited thereto. Other examples of luminescent materials include $Lu_3Al_5O_{12}$:Ce phosphors ("LuAG:Ce") and $Y_aCe_bAl_cGa_dO_z$ phosphors ("gallium-substituted YAG:Ce") that, when excited by light emitted by a blue LED, emit light having a peak wavelength in the green or yellow color ranges. These phosphors could be used instead of YAG:Ce phosphors in any of the embodiments of the present invention described herein.

The luminophoric medium 570 may also include a second phosphor 574 that emits light having a peak wavelength of between about 580 nm to 650 nm (which may be in the orange color range or the red color range depending upon the exact peak wavelength). In some embodiments, the second phosphor 574 may be a narrow-spectrum phosphor. Such narrow-spectrum orange emitters may provide higher efficacy than some conventional phosphors, particularly as the converter efficiency of some conventional red/orange-emitting phosphors is already close to unity, leaving little room to improve. Therefore, narrow-spectrum luminescent materials that emit light in the orange or red/orange wavelength range can be used in accordance with embodiments described herein to provide spectral (LER) and efficacy (LF) gains.

Specific examples of the narrow-spectrum down-converters/luminescent materials that may be used in light emitting devices according to some embodiments of the present disclosure may include, but are not limited to: cadmium (Cd)-based quantum dots (QDs) (such as $CdSe/CdS/SiO_x$, $CdSe/CdS/ZnS/SiO_x$, $CdSe/CdS/ZnS/SiO_x/ZnO$, KASIL® encapsulated Cd QDs, and/or other stabilized Cd QDs described in U.S. Patent Application Publication No. 2017/0005241 filed Jun. 29, 2016, the disclosure of which is incorporated by reference); Cd-free QDs (such as perovskite QDs and their stabilized structures, InP QDs and their stabilized structures using methods described in U.S. Patent Application Publication No. 2017/0005241, and/or Cu-based QDs (e.g., $CuIn(S/Se)_2$) and their stabilized structures using methods described in U.S. Patent Application Publication No. 2017/0005241), and phosphors with narrow emission (such as $En^{3+}$ doped phosphors (e.g., $Zn_2SnO_4$:$Eu^{3+}$), $En^{2+}$ doped phosphors (e.g., $CaS:Eu^{2+}$, $SrS:Eu^{2+}$), $Sm^{3+}$ doped phosphors, and/or other phosphors with narrow emission in orange region of the spectrum). One example of a narrow-spectrum red luminescent material may include an $A_2MF_6$:$Mn^{4+}$ red phosphor, where A is an Alkali metal and M is Si, Ge, Sn, Ti, Zr or Hf (e.g., $K_2SiF_6$:$Mn^{4+}$). Though the first yellow/green phosphor layer 572 and the second orange/red layer 574 are illustrated as an example, it will be understood that other combinations of phosphors may be used. Similarly, though the luminophoric medium 570 is illustrated as having two layers, it will be understood that a smaller number of layers (e.g., a single layer) or a larger number of layers (e.g., greater than two layers) may be provided without deviating from the present invention.

The second solid state emitter 510 includes a UV LED 580 and a clear encapsulant 584. The peak wavelength of the light emitted by the UV LED 510 may be between about 390 nm and about 415 nm, and, in particular, between about 400 nm and about 410 nm. The clear encapsulant 584 may include, for example, an epoxy-based or silicone-based curable resin, though the present invention is not limited thereto. In some embodiments, the clear encapsulant 584 may be omitted from the second solid state emitter 510. In some embodiments, UV LED 580 may emit UV light (e.g., light have a wavelength between about 390 nm and about 415 nm) from the lighting device 50 that does pass through a luminophoric medium. For example, a luminophoric medium may be absent from the UV LED 580, and the UV light emitted by the UV LED 580 may be emitted from the lighting device 50 without passing through a remote luminophoric medium.

Though the first solid state emitter 500 and the second solid state emitter 510 are illustrated adjacent one another in FIG. 5A, it will be understood that this is only an example configuration. The arrangement of one or more first solid state emitters 500 and one or more second solid state emitters 510 may be made within a lighting device 50 in any way understood to those of ordinary skill in the art so as to achieve the spectral power distribution of the lighting device 50 in which between about 2% and about 15% of a spectral power of light emitted from the lighting device is light having wavelengths in the range between about 390 nm and about 415 nm.

Figure 5B:
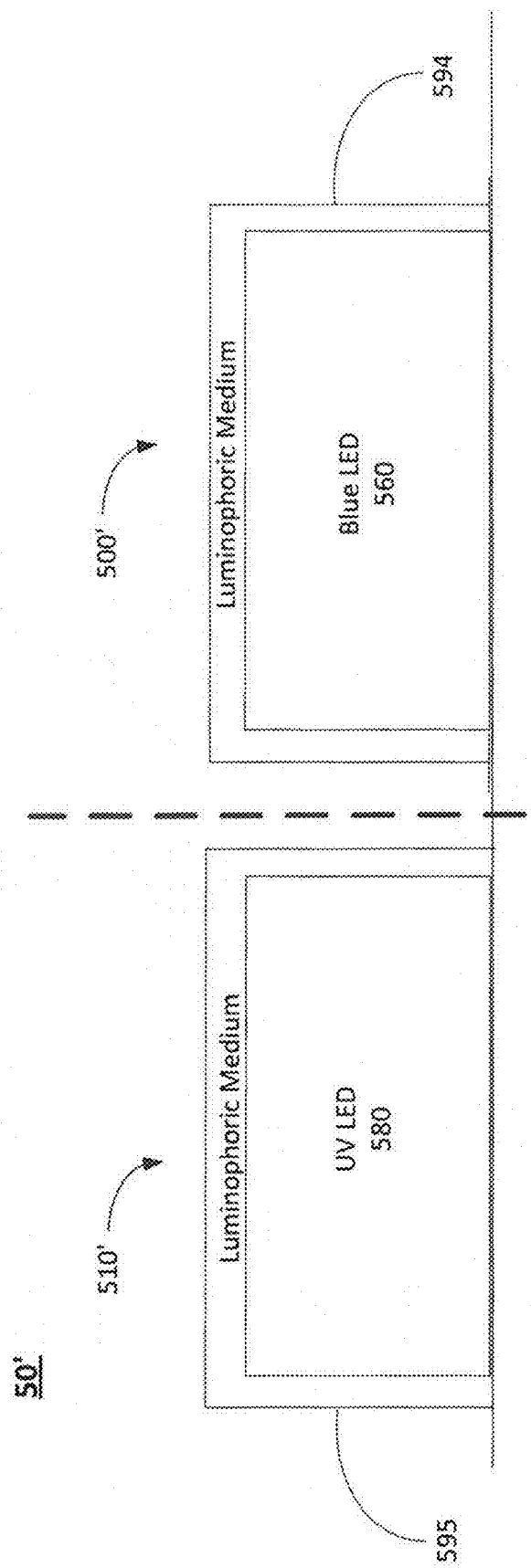

FIG. 5B illustrates additional embodiments of a lighting device 50' according to the present invention. As illustrated in FIG. 5B, a first solid state emitter 500' includes the blue LED 560 with a first luminophoric medium 594. The first luminophoric medium 594 may include one or more luminescent materials configured to convert the light emitted by the blue LED 560. For example, the first luminophoric medium 594 may include layers and/or a mixture of one or more phosphors, such as the broad-spectrum and/or narrow-spectrum phosphors described with respect to FIG. 5A. In some embodiments, the first luminophoric medium 594 may include fluorescent material (e.g., one or more phosphors) configured to convert the light emitted by the blue LED 560 to light having a peak wavelength in the red or orange color ranges and/or to light in the yellow or green color ranges, though the embodiments described herein are not limited thereto.

As also illustrated in FIG. 5B, the second solid state emitter 510' includes the UV LED 580 with a second luminophoric medium 595. The second luminophoric medium 595 may include one or more luminescent materials configured to convert the light emitted by the UV LED 580. For example, the second luminophoric medium 595 may include layers and/or a mixture of one or more phosphors, such as the broad-spectrum and/or narrow-spectrum phosphors described with respect to FIG. 5A. In some embodiments, the second luminophoric medium 595 may include fluorescent material (e.g., one or more phosphors) configured to convert the light emitted by the UV LED 580 to light having a peak wavelength in the red or orange color ranges and/or to light in the yellow or green color ranges, though the embodiments described herein are not limited thereto. In some embodiments, the first luminophoric medium 594 and the second luminophoric medium 595 may have substantially the same composition (i.e., may be substantially the same luminophoric medium). In some embodiments, the first luminophoric medium 594 and the second luminophoric medium 595 may have different compositions.

Figure 5C:
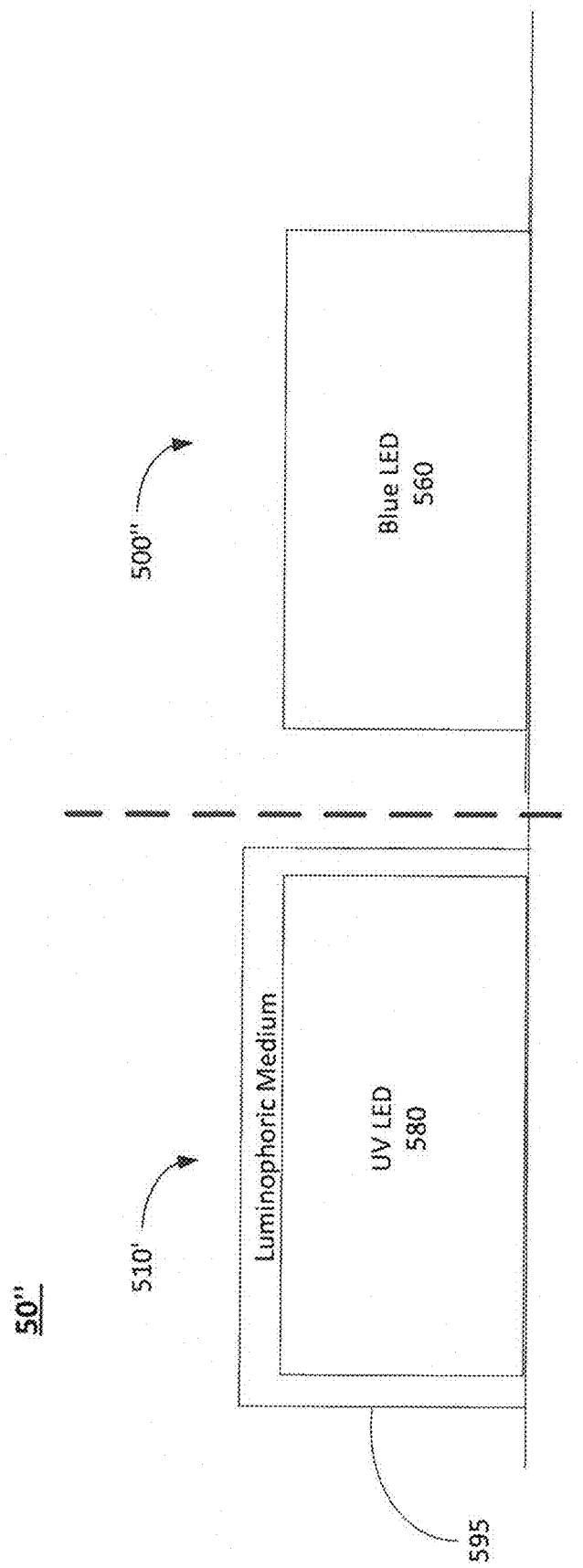

FIG. 5C illustrates a lighting device 50" according to additional embodiments of the present invention. FIG. 5C differs from FIG. 5B in that the first solid state emitter 500" does not include a luminophoric medium thereon. That is to say that the blue LED 560 may not have a converting layer of fluorescent material on it.

The embodiments of FIGS. 5A, 5B, and 5C illustrate possible configurations to generate UV light using various combinations of luminophoric media. However, it will be understood by those of ordinary skill in the art that other combinations are possible without deviating from the scope and spirit of the present invention. Thus, the embodiments of the present invention are not strictly limited to the examples illustrated herein. Rather, embodiments of the invention encompass configurations of LEDs in a lighting device in which between about 2% and about 15% of a spectral power of light emitted from the lighting device is light having wavelengths in the range between about 390 nm and about 415 nm. For example, some embodiments of the invention encompass configurations of LEDs in a lighting device in which between about 3% and about 10% and/or 4% to 8% of a spectral power of light emitted from the lighting device is light having wavelengths in the range between about 390 nm and about 415 nm. Some embodiments of the invention encompass configurations of LEDs in a lighting device in which between about 2% and about 15% of a spectral power of light emitted from the lighting device is light having wavelengths in the range between about 400 nm and about 410 nm and/or 402 nm and about 409 nm.

Figure 6A:
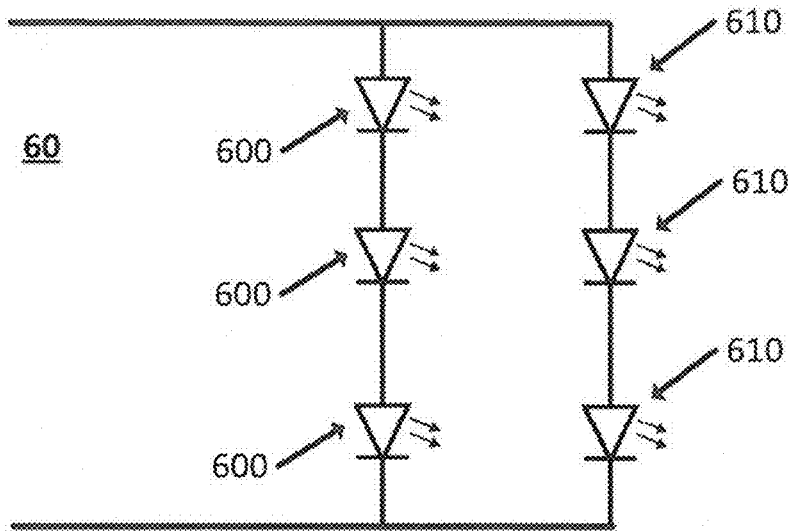
FIGS. 6A, 6B, and 6C are schematic diagrams illustrating various circuit configurations of first and second solid state emitters according to embodiments of the present invention.
Figure 6B:
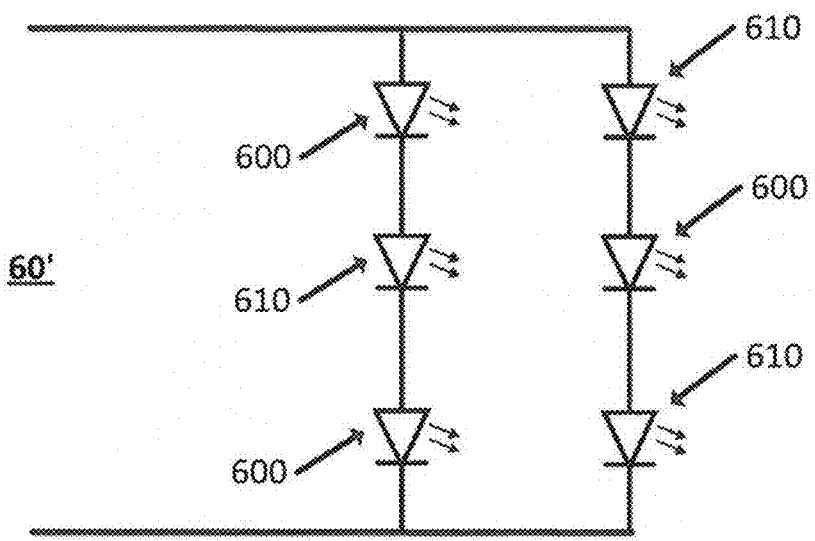
Figure 6C:
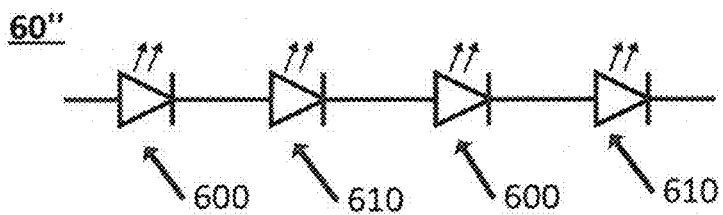

FIGS. 6A, 6B, and 6C illustrate various circuit configurations in a lighting device utilizing solid state emitters, such as the variations of the first solid state emitter 500, 500', 500" and the second solid state emitter 510, 510' illustrated in FIGS. 5A, 5B, and 5C. These examples are not intended to be limiting of the possible configurations of the first and second solid state emitters 500, 500', 500", 510, 510' but rather provide example embodiments in which the first and second solid state emitters 500, 500', 500", 510, 510' can be utilized. The first solid state emitters 500, 500', 500" and second solid state emitters 510, 510' may be arranged within the lighting device to provide power to the first solid state emitters 500, 500', 500" and second solid state emitters 510, 510' that energizes the respective LEDs thereof such that between about 2% and about 15% of a spectral power of light emitted from the lighting device is light having peak wavelengths in the range between about 390 nm and about 415 nm.

For example, FIG. 6A illustrates a lighting device 60 in which at least a portion of the lighting device 60 includes a first string of first solid state emitters 600 and a second string of solid state emitters 610 that are arranged electrically in parallel with one another. The first solid state emitters 600 may include any combination of the previous first solid state emitters 500, 500', 500" described herein with respect to FIGS. 5A, 5B, and/or 5C. The second solid state emitters 610 may include any combination of the previous second solid state emitters 510, 510' described herein with respect to FIGS. 5A, 5B, and/or 5C. The first string of first solid state emitters 600 may include a plurality of first solid state emitters 600 electrically connected in series that are configured to emit light of one or more wavelengths. The second string of second solid state emitters 610 may include a plurality of second solid state emitters 610 electrically connected in series that are configured to emit light of one or more wavelengths in the range between about 390 nm and about 415 nm. Though each of the first and second strings is illustrated with three solid state emitters, it will be recognized that other configurations are possible. For example, the first LED string may have more or fewer than three first solid state emitters 600. Similarly, the second LED string may have more or fewer than three second solid state emitters 610. In some embodiments, the number of first solid state emitters 600 may be more or fewer than the number of second solid state emitters 610.

FIG. 6B illustrates a lighting device 60' in which a portion of the lighting device 60' includes at least one string with both first solid state emitters 600 and solid state emitters 610 that are electrically connected in series. The first solid state emitters 600 may include any combination of the previous first solid state emitters 500, 500', 500" described herein with respect to FIGS. 5A, 5B, and/or 5C. The second solid state emitters 610 may include any combination of the previous second solid state emitters 510, 510' described herein with respect to FIGS. 5A, 5B, and/or 5C. The first solid state emitters 600 and second solid state emitters 610 may be combined electrically in series in various positions within the string. As illustrated in FIG. 6B, one or more of the mixed strings may be arranged electrically in parallel, though the present invention is not limited thereto.

FIG. 6C illustrates a lighting device 60" including a single string of first solid state emitters 600 and solid state emitters 610 electrically connected in series. The first solid state emitters 600 may include any combination of the previous first solid state emitters 500, 500', 500" described herein with respect to FIGS. 5A, 5B, and/or 5C. The second solid state emitters 610 may include any combination of the previous second solid state emitters 510, 510' described herein with respect to FIGS. 5A, 5B, and/or 5C. Such a configuration with a plurality of solid state emitters 600, 610 connected electrically in series may be useful, for example, in so-called filament LEDs in which solid state emitters are arranged in a line to mimic the appearance of an incandescent filament.

Figure 7:
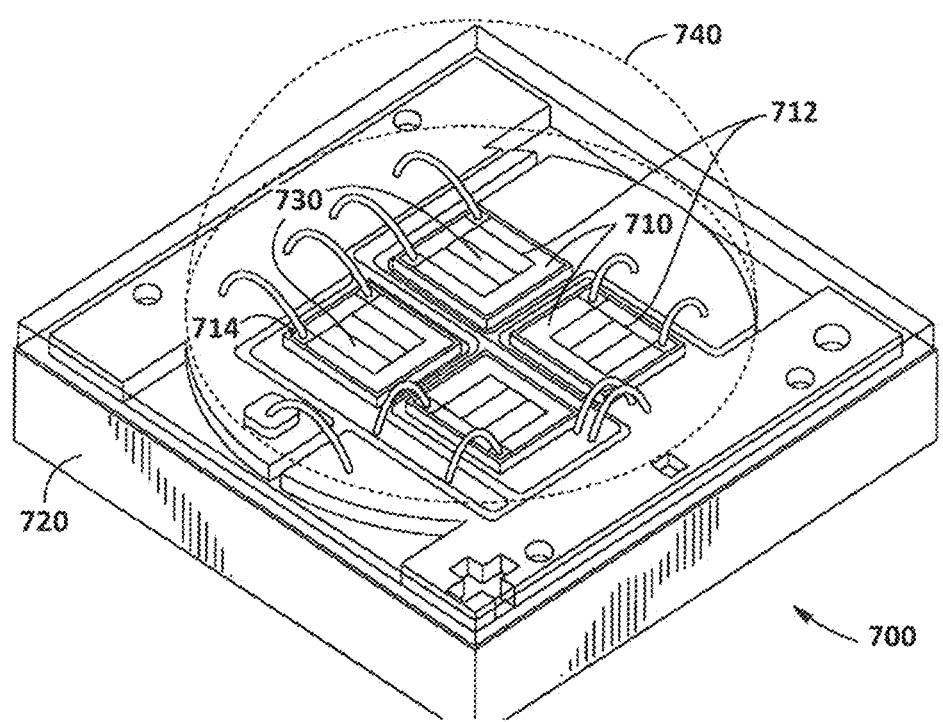
FIG. 7 is a perspective view of a semiconductor light emitting device according to further embodiments of the present invention.

FIG. 7 is a perspective view of a semiconductor light emitting device 700 according to further embodiments of the present invention. As shown in FIG. 7, the solid state light emitting device 700 includes a substrate/submount ("submount") 720 on which four LED chips or "die" 710 are mounted. The submount 720 can be formed of many different materials such as, for example, aluminum oxide, aluminum nitride, organic insulators, a printed circuit board (PCB), sapphire or silicon. The LEDs 710 can have many different semiconductor layers arranged in different ways. The LEDs 710 may include UV LED 580 and/or blue LED 560 as described herein with respect to FIGS. 5A, 5B, and 5C. LED structures and their fabrication and operation are generally known in the art and hence are only briefly discussed herein. The layers of the LEDs 710 can be fabricated using known processes such as, for example, metal organic chemical vapor deposition. Typically, LEDs are grown on a growth substrate such as, for example, a sapphire, silicon carbide, aluminum nitride (AlN), or gallium nitride (GaN) substrate to provide a grown semiconductor wafer, and this wafer is then singulated into individual LED dies 710. The growth substrate can remain as part of the final singulated LED or, alternatively, the growth substrate can be fully or partially removed. In embodiments where the growth substrate remains, it can be shaped and/or textured to enhance light extraction. The LEDs 710 may be mounted in flip chip configuration in some embodiments.

The LEDs 710 may each include a conductive current spreading structure 712 on the respective top surfaces thereof, as well as one or more contacts 714 that are accessible at its top surface for wire bonding. In other embodiments, one or both contacts 714 for each LED 710 may be on a bottom side of the LED. The current spreading structure 712 and contacts 714 can both be made of a conductive material such as Au, Cu, Ni, In, Al, Ag or combinations thereof, conducting oxides and transparent conducting oxides. The current spreading structure 712 may comprise conductive fingers that are arranged in a pattern on each LED 710 with the fingers spaced to enhance current spreading from the contacts 714 into the top surface of the LEDs 710. In operation, an electrical signal is applied to the contacts 714 through a wire bond, and the electrical signal spreads through the fingers of the current spreading structure 712 into the LED 710.

Some or all of the LEDs 710 may be coated with a luminophoric medium 730 according to embodiments of the present invention. It will be understood that the luminophoric medium 730 may comprise any of the luminophoric mediums discussed in the present application.

The luminophoric medium 730 may include a binder material, and may have different concentrations or loading of phosphor materials in the binder, with a typical concentration being in range of 40-80% by weight. In one embodiment, the phosphor concentration is approximately 75% by weight, and may be generally uniformly dispersed throughout the binder. In other embodiments the luminophoric medium 730 can comprise multiple layers of different concentrations or types of phosphors (or other luminescent materials), and the multiple layers can comprise different binder materials. One or more of the layers can be provided without phosphors. For example, a first coat of clear silicone can be deposited followed by phosphor loaded layers.

The luminophoric medium 730 may be coated on the LEDs 710 using many different methods. For example, in some embodiments, the luminophoric medium 730 may be applied to semiconductor LED wafers during the LED manufacturing process. Suitable methods for such wafer level deposition are described in U.S. Patent Application Publication Nos. 2008/0173884, filed on Jan. 22, 2007, and 2008/0179611, filed on Sep. 7, 2007, both entitled "Wafer Level Phosphor Coating Method and Devices Fabricated Utilizing Method." Alternatively the luminophoric medium 730 may be coated on the LEDs 710 using other methods such an electrophoretic deposition (EPD), with a suitable EPD method described in U.S. Patent Application Publication No. 2007/0158668, filed on Jul. 12, 2007, entitled "Close Loop Electrophoretic Deposition of Semiconductor Devices." In still other embodiments, the luminophoric medium 730 may be sprayed or otherwise applied to the LEDs 710 after the LEDs 710 have been singulated and mounted on the mounting substrate 720. As described herein, in some embodiments, the luminophoric medium 730 may not be applied to certain ones of the LEDs 710. Numerous other techniques are known in the art and are suitable for applying the recipient luminophoric mediums according to embodiments of the present invention.

An optical element or lens 740 is formed over at least part of the top surface of the submount 720 to enclose the LEDs 710 and provide both environmental and/or mechanical protection therefore. The lens 740 can be molded using different molding techniques such as those described in U.S. Patent Application Publication No. 2009/0108281, filed on Apr. 30, 2009, entitled "Light Emitting Diode Package and Method for Fabricating Same." The lens 740 can be many different shapes such as, for example, hemispheric. Many different materials can be used for the lens 740 such as silicones, plastics, epoxies, or glass. The lens 740 can also be textured to improve light extraction. In some embodiments, the lens 740 may comprise the luminophoric medium 730 and/or may be used to hold a luminophoric medium 730 in place over the LEDs 710 instead of and/or in addition to coating a luminophoric medium 730 directly onto the LED chips 710.

Figure 8A:
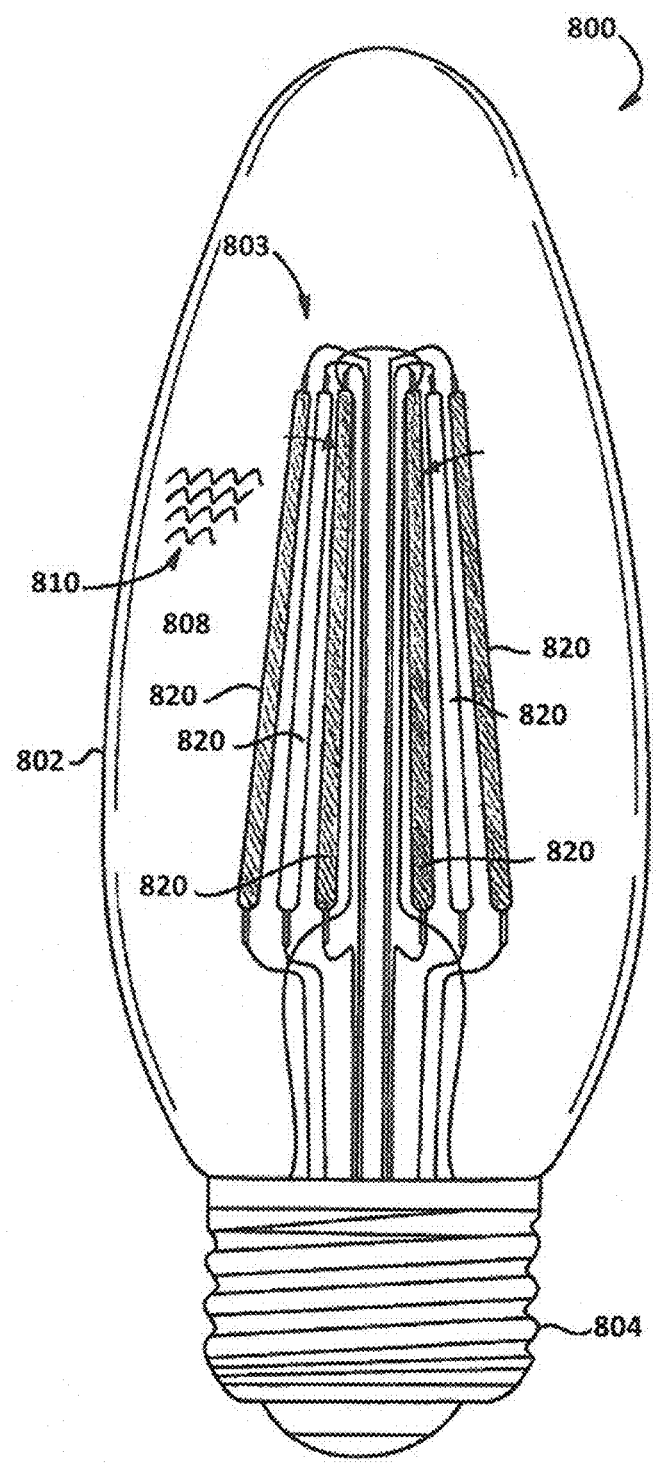

FIGS. 8A, 8B, and 8C are perspective views of a semiconductor light emitting device 800 according to further embodiments of the present invention. For example, referring to FIG. 8A, the semiconductor light emitting device 800 may have an appearance that mimics a legacy incandescent bulb. The semiconductor light emitting device 800 includes an enclosure 802 and base 804, which may be configured as an Edison-type screw connector. The base 804 may be configured to connect the semiconductor light emitting device 800 to a power signal to activate one or more of the LEDs of the light emitting device 800. Though an Edison-type base 804 is illustrated in FIG. 8A, another type of electrical connector may be used as base 804 without deviating from the scope of the present invention.

The enclosure 802 may be made of a clear or diffused material. The semiconductor light emitting device 800 may be configured to emit light through the enclosure 802. While the semiconductor light emitting device 800 illustrated in FIG. 8A has the form factor of a candelabra bulb, other form factors are possible without deviating from the scope of the present invention.

The enclosure 802 houses an LED assembly 803 of LED filaments 820. As used herein an LED filament 820 comprises a plurality of LEDs electrically connected together to form a filament-like chain or string where the LEDs extend along the length of the LED filament such that the LED filament 820 has a relatively long and narrow configuration. As illustrated in FIG. 8A, the LED filaments 820 may be arranged to extend generally parallel to a longitudinal axis of the semiconductor light emitting device 800. The configuration of LED filaments 820 illustrated in FIG. 8A is an example configuration, and the present invention is not limited thereto. LED filaments 820 according to embodiments of the present invention may take many different configurations. The LED filaments 820 may mimic the size and shape of an incandescent bulb filament. In some embodiments, different ones of the plurality of LED filaments 820 may be configured to emit light that is different in intensity and/or color than other ones of the plurality of LED filaments 820. That is to say that not all LED filaments 820 of the semiconductor light emitting device 800 will share the same configuration.

An example embodiment of the LED filament 820 is shown in FIGS. 8B and 8C. The LED filament 820 may include a substrate 822 that physically supports a plurality of LEDs 840. The LEDs 840 may include UV Led 580 and/or blue LED 560 as described herein with respect to FIGS. 5A, 5B, and 5C. The LEDs 840 may, for example, be mounted on the substrate 822 by an adhesive layer. In some embodiments, the LEDs 840 comprise LED chips that are connected in series by wire bonds or other electrical connection mechanisms such as, for example, a lead frame arrangement.

It should be noted that the term "substrate" as used herein is distinct from the semiconductor "substrate" layer of a chip such as the LEDs 840. The term "substrate" as used with respect to LED filaments such as those illustrated in FIGS. 8A, 8B, and 8C refers to substrate 822 and means a submount, similar to the submount 720 of FIG. 7, for supporting multiple LEDs 840 in the LED filament 820. The substrate 822 may be of any suitable material. For example, the substrate 822 may comprise glass, alumina, quartz or the like, or a metal such as aluminum or copper, and in some embodiments the substrate may be transparent.

As illustrated in FIGS. 8B and 8C, LED filament 820 includes a plurality of LEDs 840 connected in series, though the present invention is not limited thereto. In some embodiments, the LEDs 840 may be connected in series in a configuration similar to that illustrated in FIG. 6C. However, the exact number of LEDs 840 and/or LED filaments 820 may vary from those of the illustration, and any number of LEDs 840 or devices can be used, depending on the requirements and/or constraints of the semiconductor light emitting device 800. Pads 816 and 818 may be fastened to the ends of the substrate 822, one on each end. Each pad may provide an electrical connection point to the filament-like chain of LEDs 840. The pads 816, 818 may then be electrically coupled to the base 804 to complete the electrical path from the base 804 to the LEDs 840 to provide power to the LEDs 840.

The LEDs may be surrounded by or encapsulated in a luminophoric medium 830. It will be understood that the luminophoric medium 830 may comprise any of the luminophoric mediums discussed in the present application. Though illustrated in FIGS. 8B and 8C as a common luminophoric medium 830, it will be understood that, in some embodiments, the luminophoric medium 830 may be separately applied to one or more of the LEDs 840. Similarly, in some embodiments, some of the LEDs 840 may be at least partially covered by the luminophoric medium 830, and some of the LEDs 840 may not be covered by the luminophoric medium 830. In some embodiments, some of the LEDs 840 may be at least partially covered by a first luminophoric medium 830, and some of the LEDs 840 at least partially covered by a second luminophoric medium, different from the first luminophoric medium 830.

Note that in some of the FIGS. 8A, 8B, and 8C, the sizes and spacing of LEDs 840 and other components may be enlarged for clarity. The figures are schematic in nature and may not be to scale.

Referring again to FIG. 8A, in some embodiments the enclosure 802 may be sealed to the base 804 to create an airtight seal therebetween. The interior space 808 of the enclosure 802 may be filled with a heat conductive gas 810 such as, for example, helium, argon, nitrogen, or the like to create a more efficient heat conductive path between the LED assembly 803 and the enclosure 802 to facilitate the transfer of heat away from the LEDs 840. Though helium, argon, and nitrogen are listed as examples of the heat conductive gas 810, the present invention is not limited thereto.

Figure 9A:
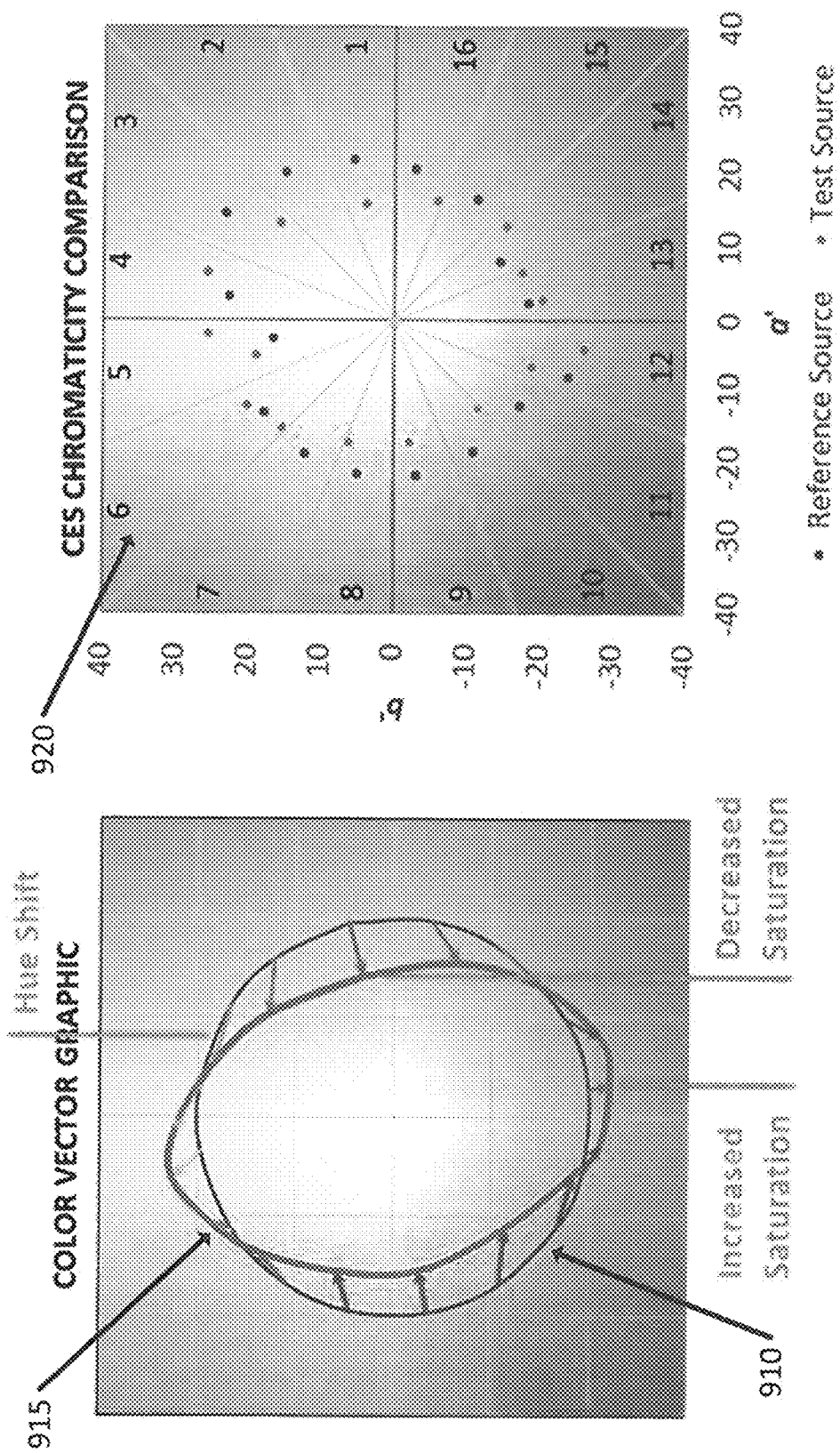
FIG. 9A illustrates an example of a TM-30 color vector graphic, including a mapping between a test light source and a reference light source.
Figure 9B:
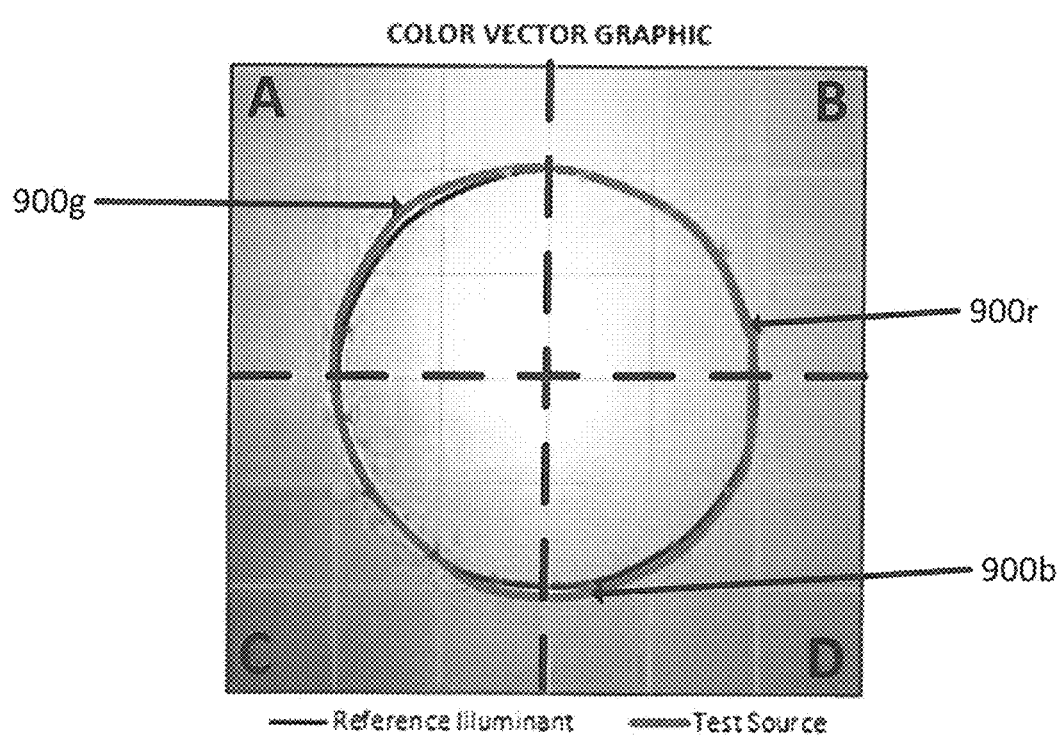
FIGS. 9B and 9C are TM-30 color vector graphics illustrating a color rendering improvement achieved by lighting devices according to embodiments discussed herein.
Figure 9C:
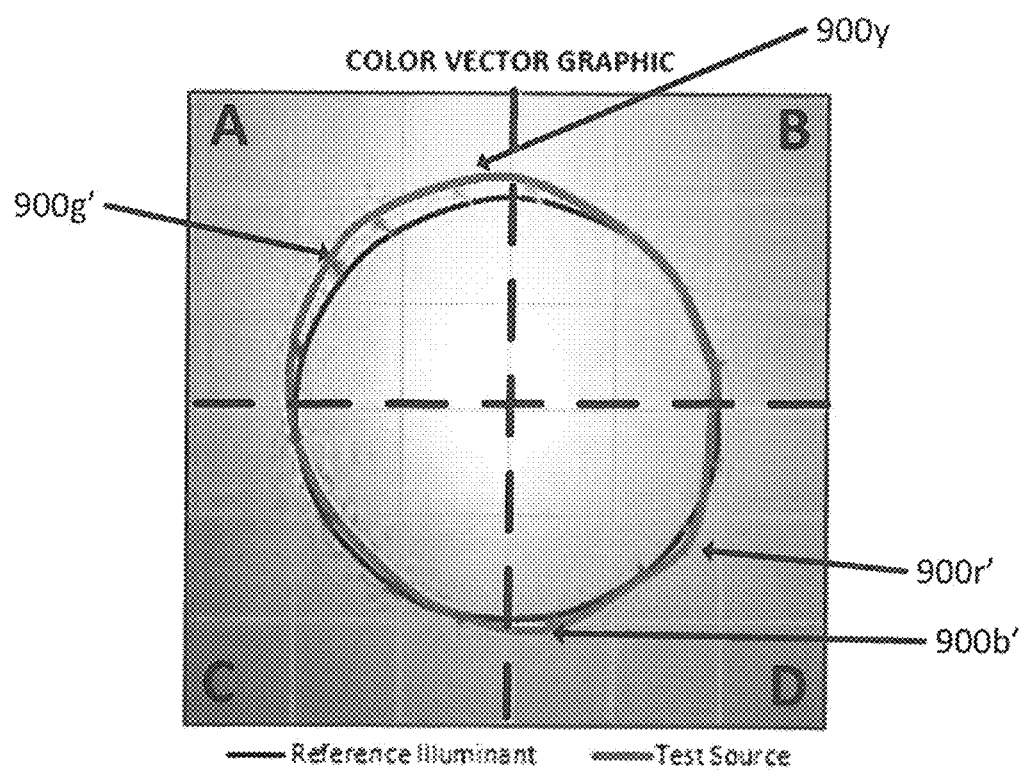

FIGS. 9A, 9B, and 9C illustrate, in part, a color vector graphic based on the Illuminating Engineering Society (IES) TM-30-15 ("TM-30") method for evaluating light source color rendering. TM-30 is a method for evaluating light source color rendering that includes numerous measures that quantify different aspects of color rendering, such as fidelity and gamut. In contrast to TM-30, CRI is purely a method for evaluating color fidelity. TM-30 does include a fidelity measure, although it is different from CRI in some ways.

One drawback of a metric such as CRI, which focuses on color fidelity, is that it does not provide information related to color distortion. For example, two light sources may have the same CRI value, but the output of the two light sources may be noticeably different if one of the light sources is saturating, for example, a red color as compared to the other light source. The light source with the saturated red color may be more visually appealing as compared to the light source that was not saturating, or desaturating, that color.

To address this, a metric related to gamut may be used. This metric expresses the extent of average color saturation or desaturation for a light source compared to a reference source. TM-30 uses the same reference source as is used for CRI. The reference source is mathematically derived, and is representative of non-electric, "natural" lighting. TM-30 compares the color rendition of a test source to the reference source at the same correlated color temperature (CCT). For sources with a CCT of 4500 K or less, the reference source is a Planckian radiator-at the right CCT this is essentially an incandescent lamp. At 5500 K or above, the reference source is the CIE D Series, a mathematical model of daylight. Between 4500 K and 5500 K, the reference source is a proportional blend of Planckian radiation and the D Series illuminant, each at the specified CCT. For example, at 4750 K, the reference illuminant is 75% Planckian radiation (at 4750 K) and 25% CIE D Series illuminant (at 4750 K).

The TM-30 method uses a color gamut metric Rg. If Rg is higher than 100, the light source is producing an average increase in saturation with respect to the reference source. If Rg is lower than 100, the light source is producing an average decrease in saturation with respect to the reference source.

TM-30 also provides a color vector graphic. The color vector graphic is a visual representation of hue and chroma shifts for all colors of a test source light. The graphical representation is based on the average chromaticity coordinates calculated for the color evaluation samples in each of 16 hue angle bins. The color vector graphic may quickly convey what types of colors are more or less saturated under the test light source relative to the reference illuminant and where hue shifts occur. These specific changes may be helpful to understanding what source will be preferred in a given application. Sub-indices for fidelity and chroma shift (i.e., saturation change) in each hue angle bin are related to the vectors displayed in the color vector graphic.

FIG. 9A illustrates an example of a TM-30 color vector graphic, including a mapping between a test light source and a reference light source. In the color vector graphic, the reference illuminant is represented by the black circle 910. In each of the 16 hue angle bins 920 (see graph on right side of FIG. 9A), the average shift created by the test source relative to the reference source for the samples in the bin is plotted with arrows. The ends of the areas are connected to form a shape 915 that characterizes the test source gamut. The test source illustrated in FIG. 9A is for example purposes only.

Where the line for the test source 915 is outside the circle 910, the test source is saturating colors in that hue range. Likewise, where the line for the test source 915 is inside the circle 900, the test source is desaturating those hues relative to the reference source. Arrows that are not perpendicular to the circle 900 indicate that a hue shift is also occurring (e.g., reds shifting to orange-reds).

FIG. 9B illustrates a TM-30 color vector graphic for a lighting device without a substantial UV contribution. The lighting device used for a test source in FIG. 9B includes a blue LED with a peak wavelength of 450 nm, including a YAG:CE phosphor and a $K_2SiF_6:Mn^{4+}$ phosphor. In this case, there is essentially no light emission having peak wavelengths in the range between about 390 nm and about 415 nm. As can be seen in the color vector graphic of FIG. 9B, the color rendering of the light is slightly oversaturated in green color ranges 900g and blue/violet color ranges 900b. These oversaturated values correspond, for example, at least in part to TM-30 hue angle bins of 6, 7, 12, and 13 (see FIG. 9A). The color rendering in the test source of FIG. 9B is slightly desaturated in red color ranges 900r, which corresponds, for example, at least in part to TM-30 hue angle bin 1.

The TM-30 color vector graphic of FIG. 9B has been separated into four quadrants labeled A, B, C, and D. Quadrant A represents ranges of color hues contributing to the green/yellow color rendering and corresponds to TM-30 hue angle bins 5, 6, 7, and 8. Quadrant B represents ranges of color hues contributing to the orange/yellow color rendering and corresponds to TM-30 hue angle bins 1, 2, 3, and 4. Quadrant C represents ranges of color hues contributing to the violet/red color rendering and corresponds to TM-30 hue angle bins 9, 10, 11, and 12. Quadrant D represents ranges of color hues contributing to the blue color rendering and corresponds to TM-30 hue angle bins 13, 14, 15, and 16.

FIG. 9C illustrates a TM-30 color vector graphic for the same lighting device of FIG. 9B in which an additional UV contribution of 7.5% has been added. That is to say that the light having peak wavelengths in the range between about 390 nm and about 415 nm makes up about 7.5% of a spectral power of light emitted from the lighting device. The UV contribution was provided by a UV LED, such as UV LED 580 of FIGS. 5A, 5B, and 5C without a luminophoric medium thereon.

As can be seen from FIG. 9C, the addition of the UV contribution to the spectral power distribution of the lighting device has provided an unexpected beneficial effect. The addition of the UV contribution to the emitted light has resulted in an increase in the oversaturation of the both the green color ranges 900g' as well as the blue/violet color ranges 900b'. In addition, the addition of the UV contribution has resulted in oversaturation in the red color ranges 900r' and oversaturation in the yellow color ranges 900y that was not previously present. Referring to FIGS. 9C and 9A, the increase in oversaturation occurs roughly in quadrants A and D) of the TM-30 color vector graphic, though the present invention is not limited thereto. In the example illustrated in FIG. 9C, an increase in saturation can be seen in TM-30 hue angle bins 4, 5, 6, 7, 8, 13, and 15, though the present invention is not limited thereto. The hue angle bins 4, 5, 6, 7, and 8 represent colors in the green-yellow color range. In some embodiments, the UV contribution may increase a saturation of the light emitting device in the green-yellow color range by at least 10% as compared to the same light emitting device without the UV contribution. In some embodiments, the UV contribution may increase a saturation of the light emitting device in hue angle bins 4-7 by at least 10% and hue angle bin 8 by at least 5% as compared to the same light emitting device without the UV contribution.

Because the UV contribution in the wavelengths of between about 390 nm and about 415 nm are on the outer fringes of the sensitivity of the human eye (see FIG. 3), the increase in the saturation of the above-discussed visible areas of the color ranges is unexpected. Moreover, since saturated color can be perceived by the human eye as more attractive, especially colors in the green-yellow range, the relatively small contribution of UV light described herein can result in a significant increase in perceived color rendering performance for the light. The embodiments of the present invention described herein result from a recognition by the inventors that such a counterintuitive application of light having peak wavelengths in the range between about 390 nm and about 415 nm results in a light that has a higher perceived color rendering performance. Lighting devices utilizing this recognition may be made higher performing with little additional package design, as the UV LEDs described herein may be incorporated within an existing LED configuration in any number of ways.

Techniques as described herein improve the operation of any solid-state emitters configured to generate white light. For example, the techniques described herein may include providing a UV contribution having a peak wavelength of between about 390 nm and about 415 nm in combination with a blue LED having a luminophoric medium that includes a LuAG:Ce or YAG:Ce phosphor and a broad-spectrum red phosphor such as $(Ca_{1-x}Sr_x)SiAlN_3:Eu^{2+}$. For example, the techniques described here may also include providing a UV contribution having a peak wavelength of between about 390 nm and about 415 nm in combination with a blue LED having a luminophoric medium that includes a LuAG:Ce or YAG:Ce phosphor and a narrow-spectrum red phosphor such as $K_2SiF_6:Mn^{4+}$. For example, the techniques described here may also include providing a UV contribution having a peak wavelength of between about 390 nm and about 415 nm in combination with a blue LED having a luminophoric medium that includes a LuAG:Ce or YAG:Ce phosphor and a red AlInGaP LED.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The present invention has been described above with reference to the accompanying drawings, in which certain embodiments are shown. However, this disclosure should not be construed as limited to the embodiments set forth herein. Rather, these embodiments are provided so that this disclosure will be thorough and complete, and will fully convey the scope of the disclosure to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the present invention. As used herein, the singular forms "a". "an" and "the" are intended to include the plural forms as well, unless the context clearly indicates otherwise. It will be further understood that, when used in this specification, the terms "comprises" and/or "including" and derivatives thereof, specify the presence of stated elements and/or components, but do not preclude the presence or addition of one or more other elements, components, and/or groups thereof.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region, or layer discussed below could be termed a second element, component, region, or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

In the drawings and specification, there have been disclosed embodiments of the disclosure and, although specific terms are employed, they are used in a generic and descriptive sense only and not for purposes of limitation, the scope of the disclosure being set forth in the following claims.

That which is claimed:

1. A light emitting device, comprising:
   a first group of at least one first solid state emitter, each first solid state emitter comprising a first light emitting diode ("LED") that, when excited, emits light having a peak wavelength in a range between about 440 nm and about 475 nm; and
   a second group of at least one second solid state emitter, each second solid state emitter comprising a second LED that, when excited, emits light having a peak wavelength in a range between about 390 nm and about 415 nm,
   wherein the emission of the light in the 390 nm to 415 nm wavelength range is configured to increase a saturation of a remainder of the emitted light of the light emitting device in a blue-violet color range while maintaining a luminous flux of the light emitting device between 100 lumens per watt and 140 lumens per watt.

2. The light emitting device of claim 1, wherein the light having wavelengths in the range between about 390 nm and about 415 nm is further configured to increase a saturation of the remainder of the emitted light of the light emitting device in a green color range while maintaining a luminous flux of the light emitting device between 100 lumens per watt and 140 lumens per watt.

3. The light emitting device of claim 1, wherein between about 2% and about 15% of a spectral power of the light emitted from the light emitting device is the light having wavelengths in the range between about 390 nm and about 415.

4. The light emitting device of claim 1, wherein the emission of the light in the 390 nm to 415 nm wavelength range is further configured to increase the saturation of the remainder of the emitted light of the light emitting device in the 4, 5, 6, and 7 TM-30 hue angle bins by at least 10%.

5. The light emitting device of claim 4, wherein the emission of the light in the 390 nm to 415 nm wavelength range is further configured to increase the saturation of the remainder of the emitted light of the light emitting device in the 8 TM-30 hue angle bin by at least 5%.

6. The light emitting device of claim 1, wherein each first solid state emitter further comprises a first luminophoric medium that includes at least a first luminescent material that, when excited by light from the first solid state emitter, emits light having a peak wavelength in a green color range or a yellow color range, and a second luminescent material that, when excited by light from the first solid state emitter, emits light having a peak wavelength in an orange color range or a red color range.

7. The light emitting device of claim 6, wherein the second luminescent material comprises a $K_2SiF_6:Mn^{4+}$ phosphor.

8. The light emitting device of claim 6, wherein the first luminescent material comprises a YAG:Ce phosphor.

9. The light emitting device of claim 6, wherein the second luminescent material comprises a narrow-spectrum red phosphor.

10. The light emitting device of claim 6, wherein each second solid state emitter further comprises a second luminophoric medium.

11. The light emitting device of claim 1, wherein each second solid state emitter does not include any associated luminophoric medium thereon.

12. The light emitting device of claim 1, wherein a ratio of a first chip area of the first group of the at least one first solid state emitter to a second chip area of the second group of the at least one second solid state emitter is between 2:1 and 4:1.

13. The light emitting device of claim 1, wherein between about 2% and about 15% of a spectral power of light emitted from the light emitting device is the light in the 390 nm to 415 nm wavelength range.

14. The light emitting device of claim 1, wherein exciting the second group of the at least one second solid state emitter is configured to increase a saturation of the light emitted from the light emitting device in a green color range.

15. The light emitting device of claim 14, wherein exciting the second group of the at least one second solid state emitter is further configured to increase a saturation of the light emitted from the light emitting device in a yellow color range.

16. A light emitting device, comprising:
a first group of at least one first solid state emitter, each first solid state emitter comprising a first light emitting diode ("LED") that, when excited, emits light having a peak wavelength in a range between about 440 nm and about 475 nm; and
a second group of at least one second solid state emitter, each second solid state emitter comprising a second LED that, when excited, emits light having a peak wavelength in a range between about 390 nm and about 415 nm,
wherein the emission of the light in the 390 nm to 415 nm wavelength range is configured to increase a saturation of a remainder of the emitted light of the light emitting device in at least one of the 4, 5, 6, and 7 TM-30 hue angle bins by at least 10%.

17. The light emitting device of claim 16, wherein the light emitting device is configured to emit the light having a luminous flux of between 100 and 140 lumens per watt.

18. The light emitting device of claim 17, wherein the light emitting device is further configured to emit the light having the luminous flux of between 100 and 140 lumens per watt with a color rendering index ("CRI") of at least 94.

19. The light emitting device of claim 16, wherein the second group of at least one second solid state emitter does not include any associated luminophoric medium thereon.

20. The light emitting device of claim 16, wherein between about 2% and about 15% of a spectral power of light emitted from the light emitting device is the light in the 390 nm to 415 nm wavelength range.

* * * * *